United States Patent
Furuta et al.

(10) Patent No.: US 9,480,156 B2
(45) Date of Patent: *Oct. 25, 2016

(54) METHOD FOR MANUFACTURING PRINTED WIRING BOARD

(75) Inventors: Toru Furuta, Ogaki (JP); Kotaro Takagi, Ogaki (JP); Michio Ido, Ogaki (JP); Fumitaka Takagi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 1194 days.

This patent is subject to a terminal disclaimer.

(21) Appl. No.: 13/406,915

(22) Filed: Feb. 28, 2012

(65) Prior Publication Data

US 2012/0151764 A1    Jun. 21, 2012

Related U.S. Application Data

(63) Continuation of application No. 12/685,716, filed on Jan. 12, 2010, now Pat. No. 8,153,905.

(60) Provisional application No. 61/156,122, filed on Feb. 27, 2009.

(51) Int. Cl.
*H05K 3/20* (2006.01)
*H05K 1/11* (2006.01)
(Continued)

(52) U.S. Cl.
CPC ........... *H05K 1/111* (2013.01); *H01L 21/4846* (2013.01); *H01L 23/49827* (2013.01); *H01L 23/49866* (2013.01); *H01L 23/49811* (2013.01); *H01L 23/49816* (2013.01); *H01L 2224/16225* (2013.01); *H01L 2224/16227* (2013.01);
(Continued)

(58) Field of Classification Search
CPC .... H05K 1/0298; H05K 1/056; H05K 1/142; H05K 1/144; H05K 3/022; H05K 1/09; H05K 1/182; H05K 2203/04; H05K 2203/0703; H05K 3/0067; H05K 3/007; H05K 3/32; Y10T 29/49128; Y10T 29/4913; Y10T 29/49147; Y10T 29/49155; Y10T 29/49165; Y10T 29/49169; Y10T 29/4919; Y10T 29/49208
USPC ................. 29/831, 832, 842, 846, 852, 866; 174/254, 255, 256, 259, 261; 156/233, 156/272.2, 273.3, 275.5, 289, 344
See application file for complete search history.

(56) References Cited

U.S. PATENT DOCUMENTS 5,746,868 A * 5/1998 Abe ........................... 156/247
6,143,116 A * 11/2000 Hayashi et al. ............. 156/233
(Continued)

FOREIGN PATENT DOCUMENTS

JP    2006-005158    1/2006

*Primary Examiner* — Paul D Kim
(74) *Attorney, Agent, or Firm* — Oblon, McClelland, Maier & Neustadt, L.L.P.

(57) ABSTRACT

A method for manufacturing a printed wiring board includes forming a metal film on a surface of an insulative board, a plating resist on the metal film, and a plated-metal film on the metal film exposed from the plating resist, covering a portion of the plated-metal film with an etching resist, etching to reduce thickness of the plated-metal film exposed from the etching resist, removing the resists, and forming a wiring having a pad and a conductive circuit thinner than the pad by removing the metal film exposed through the removing of the plating resist, a solder-resist layer on the surface of the board and wiring, in the layer an opening exposing the pad and a portion of the circuit contiguous to the pad, a solder film on the pad and portion of the circuit exposed through the opening, and a solder bump on the pad by solder reflow.

9 Claims, 20 Drawing Sheets

(51) Int. Cl.
*H01L 21/48* (2006.01)
*H01L 23/498* (2006.01)
*H05K 3/10* (2006.01)
*H05K 3/34* (2006.01)
*H05K 3/46* (2006.01)

(52) U.S. Cl.
CPC ............... *H01L2224/81192* (2013.01); *H01L 2224/81193* (2013.01); *H01L 2924/15311* (2013.01); *H05K 3/108* (2013.01); *H05K 3/3484* (2013.01); *H05K 3/4644* (2013.01); *H05K 2201/0367* (2013.01); *H05K 2201/09736* (2013.01); *H05K 2203/0369* (2013.01); *H05K 2203/043* (2013.01); *Y02P 70/611* (2015.11); *Y10T 29/49117* (2015.01); *Y10T 29/49124* (2015.01); *Y10T 29/49155* (2015.01); *Y10T 29/49156* (2015.01)

(56) References Cited

U.S. PATENT DOCUMENTS

| | | | |
|---|---|---|---|
| 6,229,711 B1 | 5/2001 | Yoneda | |
| 6,994,414 B2* | 2/2006 | Hashimoto et al. | 347/19 |
| 7,223,687 B1* | 5/2007 | Ho et al. | 438/622 |
| 2009/0183906 A1 | 7/2009 | Kobayashi et al. | |
| 2010/0218980 A1 | 9/2010 | Furuta et al. | |
| 2010/0218983 A1* | 9/2010 | Furuta et al. | 174/257 |
| 2010/0221414 A1 | 9/2010 | Furuta et al. | |
| 2012/0103931 A1 | 5/2012 | Furuta et al. | |
| 2012/0181708 A1* | 7/2012 | Furutani et al. | 257/787 |

* cited by examiner

FIG. 1(A)
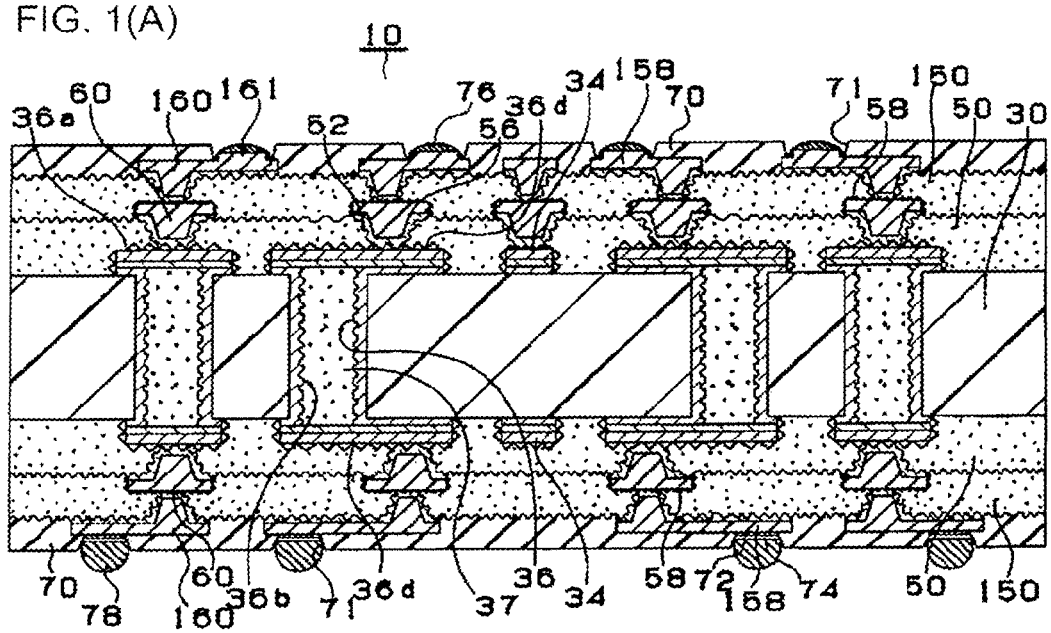
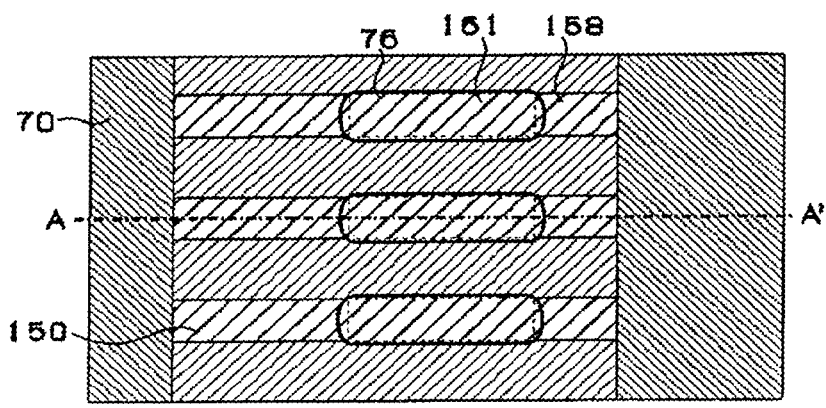
FIG. 1(B)
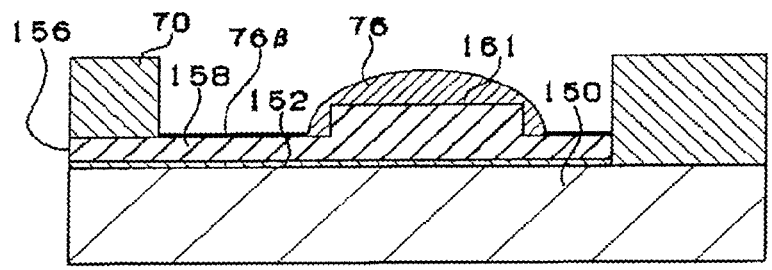
FIG. 1(C)
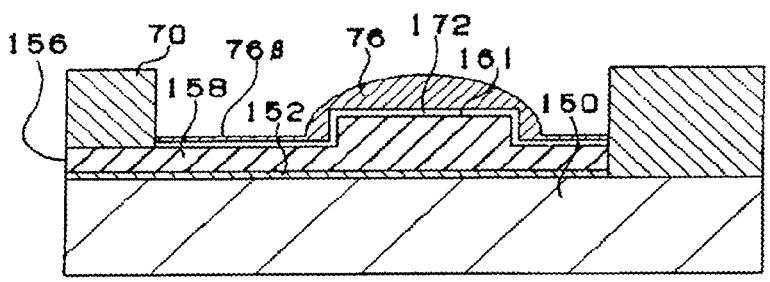
FIG. 1(D)

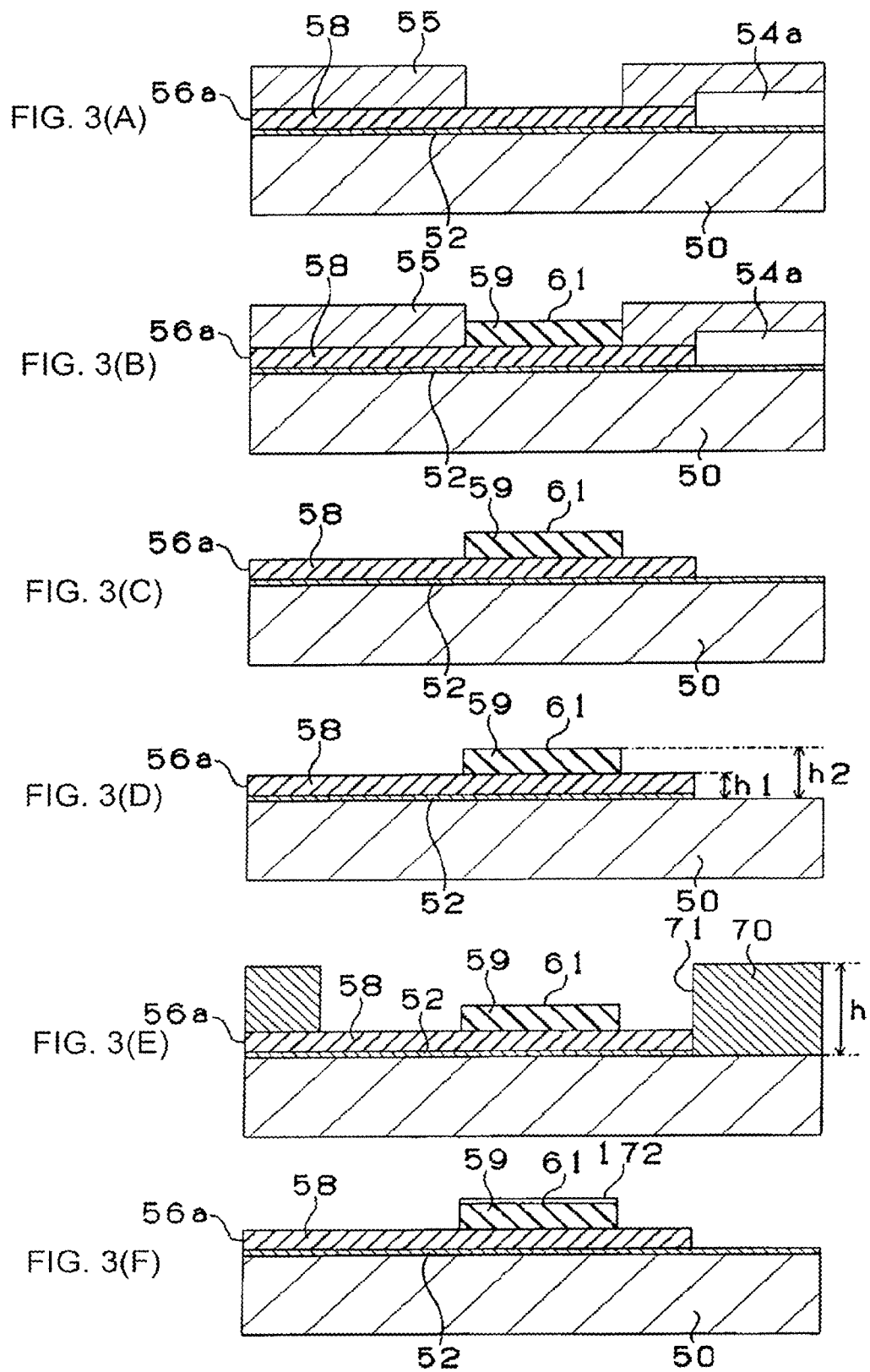

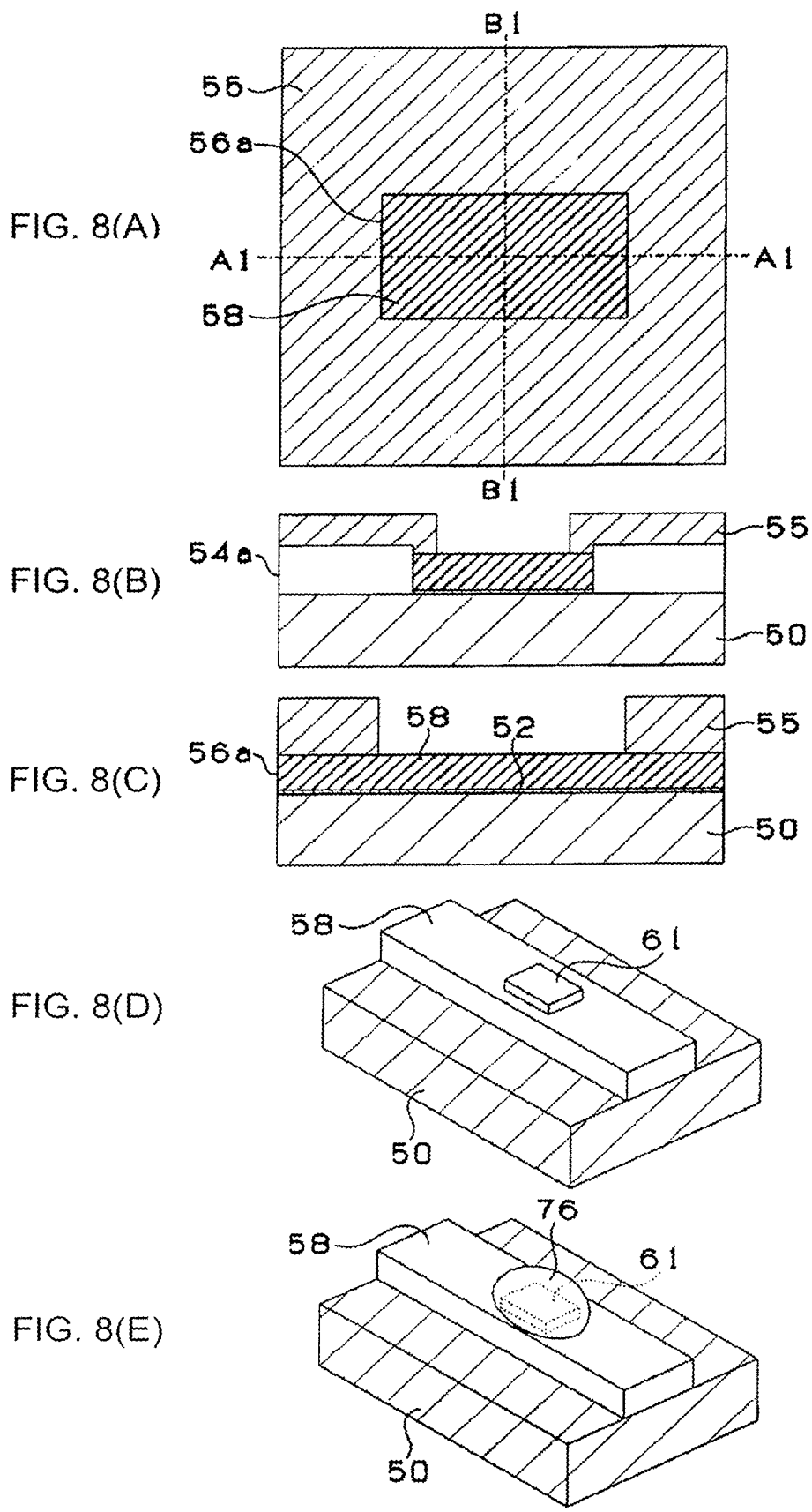

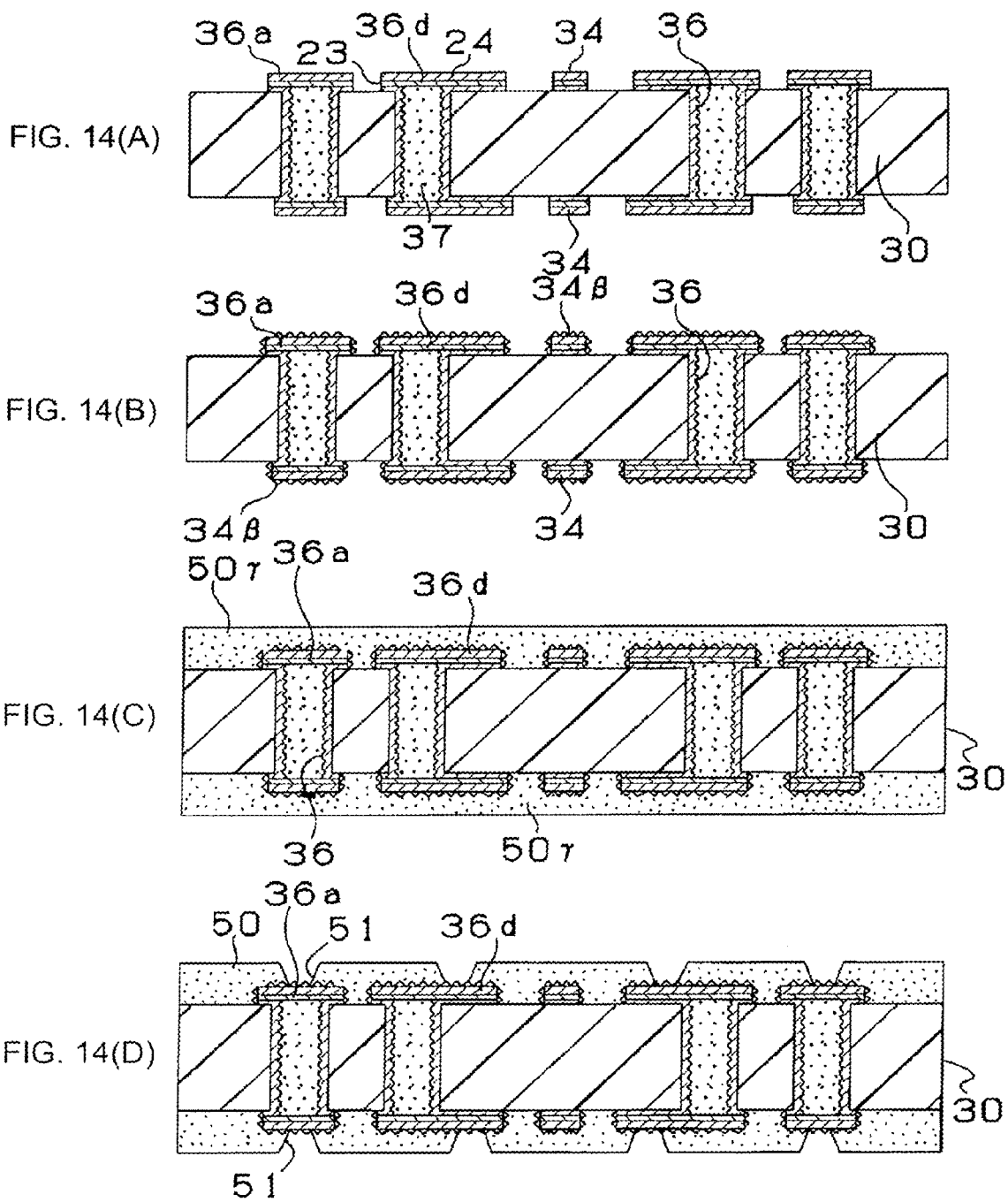

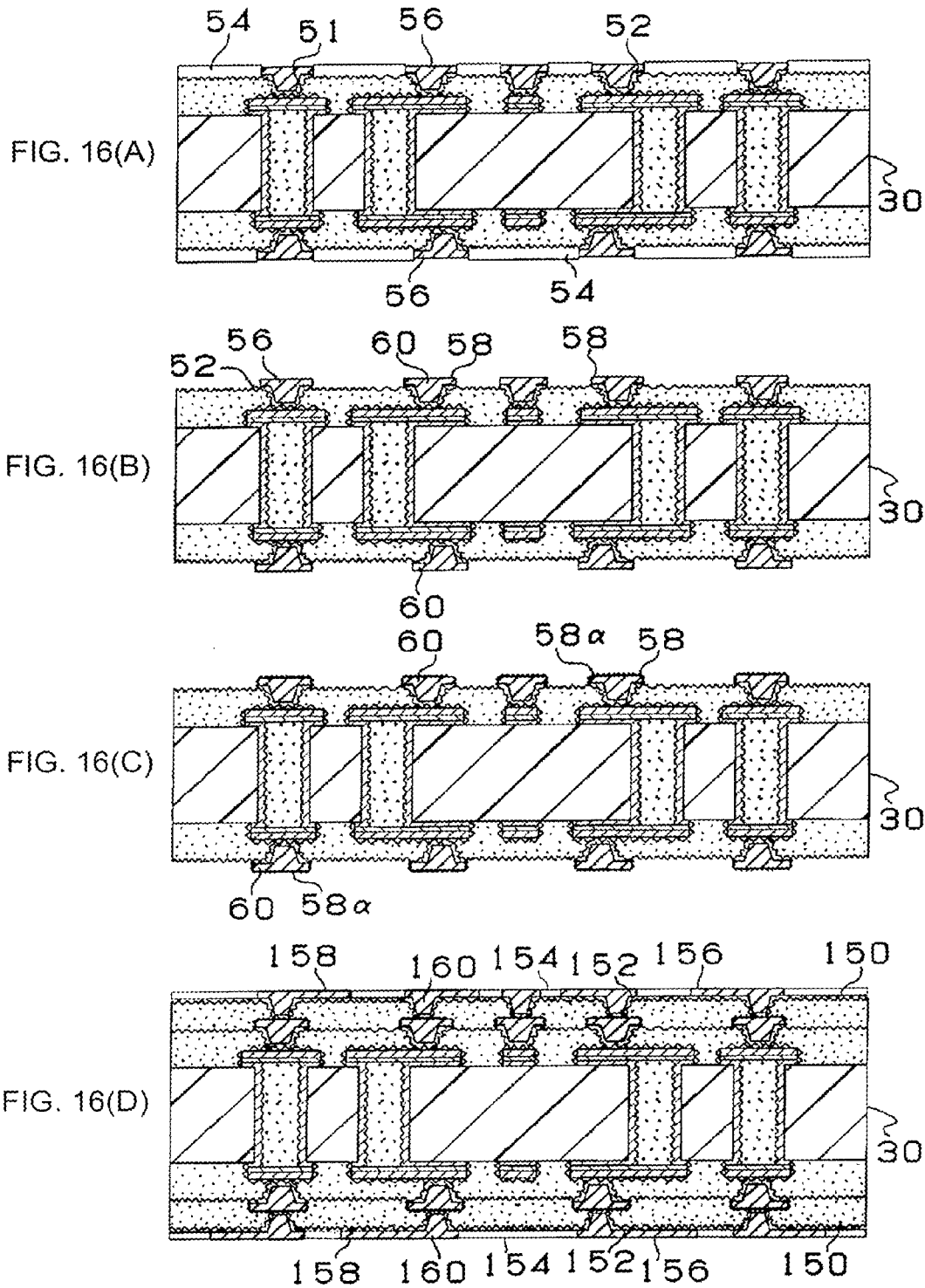

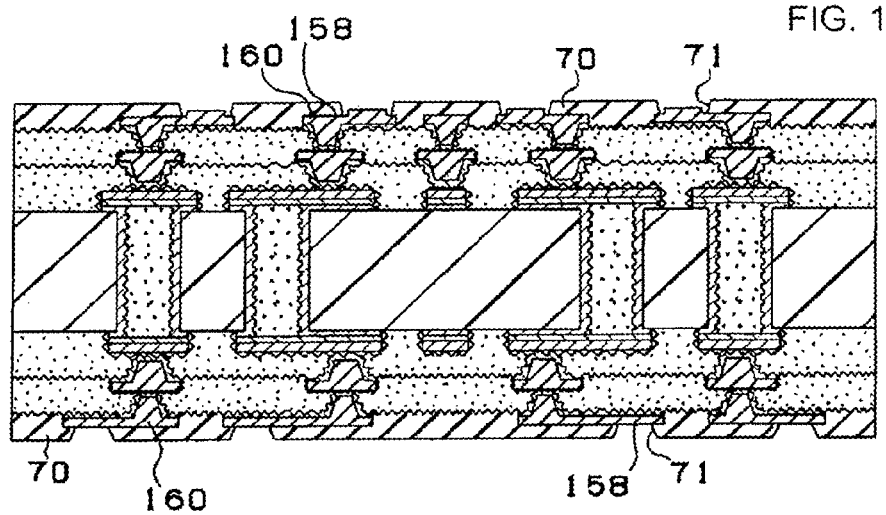
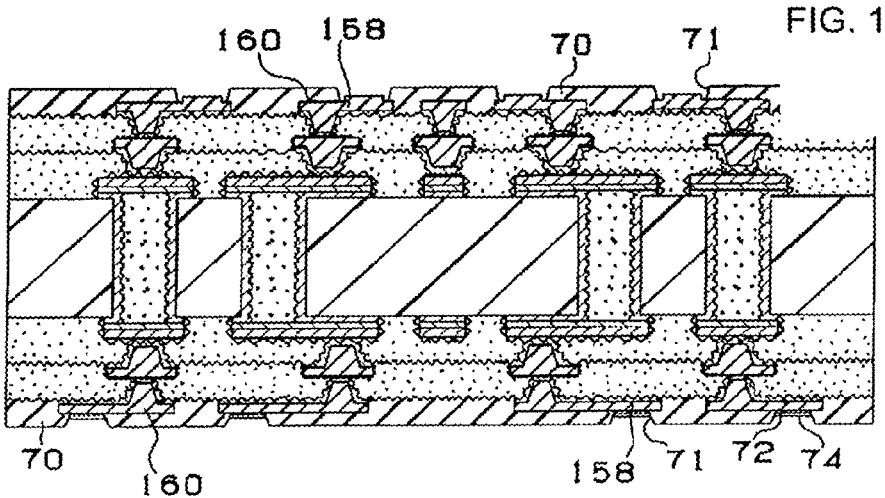
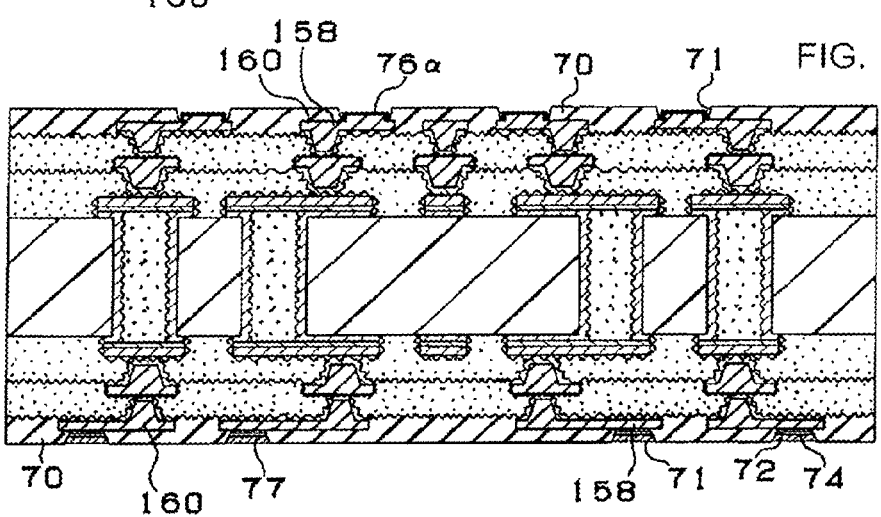

METHOD FOR MANUFACTURING PRINTED WIRING BOARD

CROSS-REFERENCE TO RELATED APPLICATIONS

The present application is a continuation of and claims the benefit of priority to U.S. application Ser. No. 12/685,716, filed Jan. 12, 2010, now U.S. Pat. No. 8,215,905, which is based on and claims the benefit of priority to U.S. application Ser. No. 61/156,122, filed Feb. 27, 2009. The entire contents of these applications are incorporated herein by reference.

BACKGROUND OF THE INVENTION

1. Field of the Invention

The present invention is related to a printed wiring board on which to mount an electronic component such as an IC chip; especially to a printed wiring board with a pad for flip-chip connection.

2. Discussion of the Background

In Japanese Laid-Open Patent Publication 2006-005158, the content of which are incorporated herein by reference in their entirety, the following is described as a method for manufacturing a printed wiring board having a pad for flip-chip connection as part of a conductive circuit: Namely, a predetermined spot of a conductive circuit to form a pad for flip-chip connection is covered with an etching mask, the thickness of the area left exposed by the etching mask is reduced by half etching, and the pad whose thickness is greater than the half-etched area will be exposed. Also, in Japanese Laid-Open Patent Publication 2006-005158, since the pad is formed thicker relative to the conductive circuit, agglomeration of solder on the pad is not required, and the solder on the pad becomes elevated by the difference between the thickness of the pad and the thickness of the conductive circuit.

SUMMARY OF THE INVENTION

A method for manufacturing a printed wiring board according to one aspect of the present invention is as follows: preparing an insulative board; forming a metal film on a surface of the insulative board; forming a plating resist on the metal film; forming a plated-metal film on the metal film exposed from the plating resist; covering a portion of the plated-metal film with an etching resist; etching to reduce the thickness of the plated-metal film exposed from the etching resist; removing the etching resist; removing the plating resist; by removing the metal film exposed through the removal of the plating resist, forming a wiring made up of a pad and a conductive circuit thinner than the pad; forming a solder-resist layer on the surface of the insulative board and the wiring; forming in the solder-resist layer an opening that exposes the pad and a portion of the conductive circuit contiguous to the pad; forming a solder film on the pad and portion of the conductive circuit exposed through the opening; and forming a solder bump on the pad by agglomerating solder on the pad through a reflow.

A method for manufacturing a printed wiring board according to another aspect of the present invention is as follows: preparing an insulative board; forming a metal film on a surface of the insulative board; covering a portion of the metal film with a first plating resist; forming a first plated-metal film on the metal film exposed from the first plating resist; covering part of the first plated-metal film with a second plating resist; forming a second plated-metal film on the first plated-metal film exposed from the second plating resist; removing the first and second plating resists; by removing the metal film left exposed by the first and second plated-metal films, forming a wiring made up of a pad and a conductive circuit thinner than the pad; forming a solder-resist layer on the surface of the insulative board and the wiring; forming in the solder-resist layer an opening that exposes the pad and a portion of the conductive circuit contiguous to the pad; forming solder film on the pad and portion of the conductive circuit exposed through the opening; and forming a solder bump on the pad by agglomerating solder on the pad through a reflow.

A printed wiring board according to yet another aspect of the present invention has the following: an insulative board; a wiring formed on a surface of the insulative board, and made up of a pad for mounting an electronic component and of a conductive circuit contiguous to the pad; and a solder bump formed on the pad and a portion of the conductive circuit contiguous to the pad. In such a printed wiring board, the thickness of the pad is greater than the thickness of the conductive circuit, and the thickness of the solder bump on the pad is greater than the thickness of the solder bump on the conductive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(A)-1(D) are cross-sectional views and a top view of a multilayer printed wiring board according to an embodiment of the present invention;

FIGS. 3(A)-3(F) are views showing the steps of a method for manufacturing a printed wiring board according to the first embodiment;

FIGS. 8(A)-8(E) are a top view and cross-sectional views showing a modified example of the multilayer printed wiring board according to the first embodiment;

FIGS. 14(A)-14(D) are views showing the steps of a method for manufacturing a multilayer printed wiring board according to the first example of the present invention;

FIGS. 16(A)-16(D) are views showing the steps of a method for manufacturing a multilayer printed wiring board according to the first example of the present invention;

FIGS. 18(A)-18(C) are views showing the steps of a method for manufacturing a multilayer printed wiring board according to the first example of the present invention;

DETAILED DESCRIPTION OF THE EMBODIMENTS

Figure 2A:
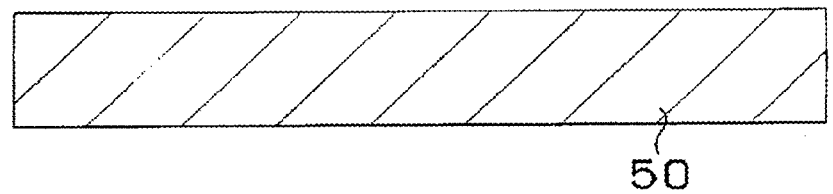
FIGS. 2(A)-2(D) are views showing the steps of a method for manufacturing a printed wiring board according to the first embodiment.

The embodiments will now be described with reference to the accompanying drawings, wherein like reference numerals designate corresponding or identical elements throughout the various drawings.

First Embodiment

The structure of a printed wiring board according to the present invention is described with reference to FIGS. 1A-1C. FIG. 1A is a cross-sectional view showing multilayer printed wiring board 10. In multilayer printed wiring board 10, conductive circuits 34 are formed on the surfaces of core substrate 30. The front and back surfaces of core substrate 30 are connected by means of through-holes 36. Through-holes 36 are made up of plated cover layers (36a, 36d) which form through-hole lands and of side-wall conductive layers (36b). In the interiors surrounded by side-wall conductive layers (36b), resin filler 37 is filled. Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuits 158. Solder bumps 76 are arranged on pads 161. Solder resist layers 70 are formed on resin insulation layers 150. Part of conductive circuits 158 and pads 161 are exposed through opening portions 71 of upper-side solder resist layer 70; and bumps 78 are formed in lower-side opening portions 71.

FIG. 1B is a magnified top view showing part of multilayer printed wiring board 10. FIG. 1C is a cross-sectional view seen from the (A-A') line in FIG. 1B. The thickness of pad 161 is set to be greater than the thickness of conductive circuit 158, preferably approximately 2-10 μm thicker. On pad 161, solder bump 76 is formed with a mountain-shaped profile or a half-elliptic profile. Solder film (76β) is formed on conductive circuit 158 left exposed by solder-resist layer 70. The thickness of solder bump 76 on pad 161 is preferred to be 1.1-15 times thicker than the thickness of solder film (76β) on conductive circuit 158. The thickness of the solder bump on the pad according to the present invention indicates the largest thickness of solder bump 76 measured from the top surface of pad 161; and the thickness of the solder film on the conductive circuit indicates the largest thickness of solder film (76β) measured from the top surface of conductive circuit 158. As FIG. 1D shows another example of FIG. 1C, metal layer 172 selected from among Ni, Au, Sn, Pd, Ag and Pt may be formed on conductive circuit 158. By forming a metal layer, oxidation of the surface of the conductive circuit may be prevented.

Next, a method for manufacturing printed wiring board 10 according to the first embodiment of the present invention is described with reference to FIGS. 2-4.

Figure 2B:
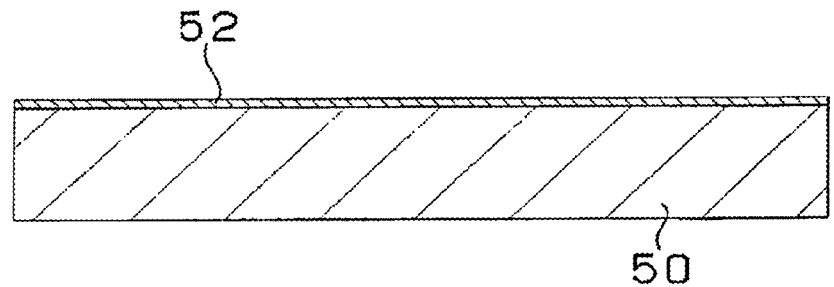

(1) On insulation layer 50 made of resin (FIG. 2A), metal film 52 made of copper or the like is formed (FIG. 2B). Such metal film may be formed by forming electroless plated-metal film, forming electroless plated-metal film and electrolytic plated-metal film, pressing metal foil on a prepreg and so forth.

Figure 2C:
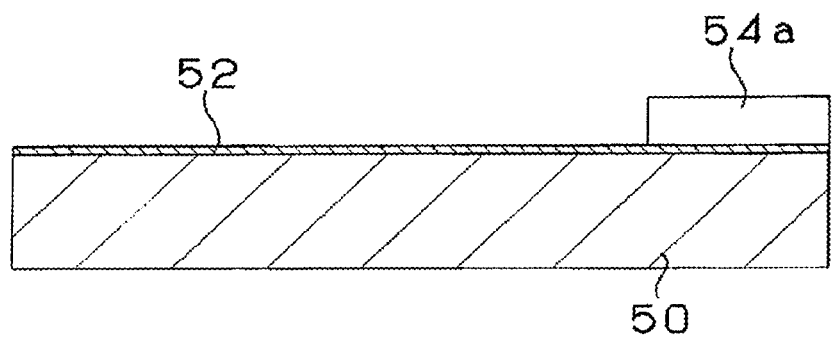
Figure 2D:
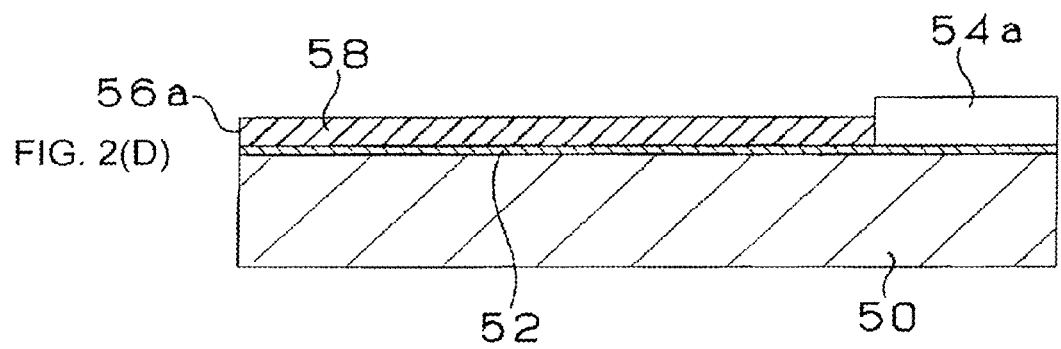

(2) First plating resist (54a) for forming a pad and conductive circuit is formed on metal film 52 (FIG. 2C). Then, the substrate is immersed in an electrolytic plating solution, and an electrical current is passed through metal film 52. Accordingly, first electrolytic copper-plated film (56a) is formed in the area where plating resist is not formed (FIG. 2D).

(3) Second plating resist 55 for forming a pad is formed on first electrolytic copper-plated film (56a), which will become conductive circuit (FIG. 3A). The substrate is immersed in an electrolytic plating solution, and second electrolytic copper-plated film 59 with a thickness of 2-10 μm is formed on the area of first electrolytic copper-plated film (56a) where second plating resist 55 is not formed (FIG. 3B).

(4) First plating resist (54a) and second plating resist 55 are removed and the following are formed: conductive circuit 58 made from first electrolytic copper-plated film (56a), and pad 61 made up of first electrolytic copper-plated film (56a) and second electrolytic copper-plated film 59 formed on first electrolytic copper-plated film (56a) (FIG. 3C). Then, metal film 52 under first plating resist (54a) is removed by etching (FIG. 3D). In doing so, conductive circuit 58 with thickness (h1) of 15 μm and pad 61 with thickness (h2) of 18-25 μm are formed.

(5) On insulation layer 50, opening portion 71 exposing pad 61 is arranged and solder resist layer 70 with thickness (h3) of 25-35 μm is formed (FIG. 3E). After that, metal layer 172 shown in FIG. 1D to prevent oxidation may be formed. In yet another example, such a metal layer may be formed after electrolytic copper-plated film 59 shown in FIG. 3B is formed. In such a case, a metal film is formed only on the top surface of the pad (FIG. 3F).

Figure 4A:
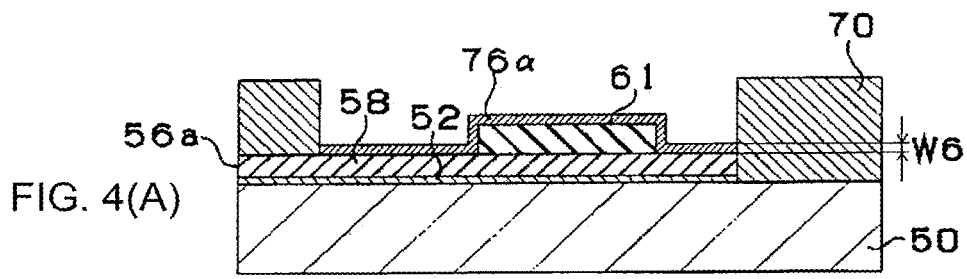
FIGS. 4(A)-4(E) are views showing the steps of a method for manufacturing a printed wiring board according to the first embodiment.
Figure 4B:
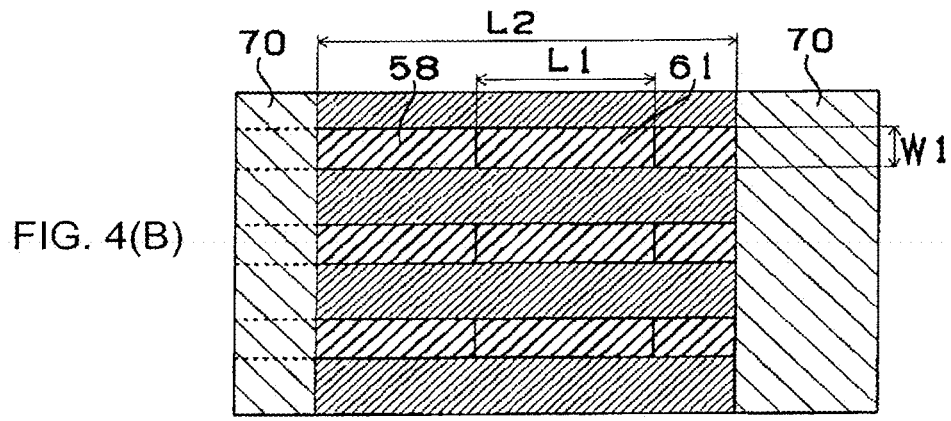
Figure 4C:
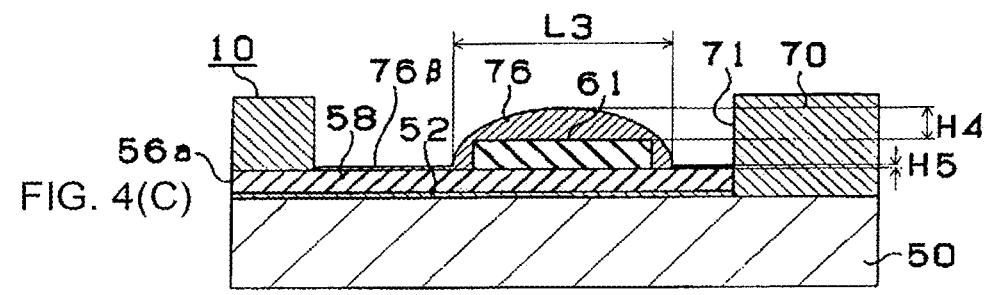

(6) On pad 61 and conductive circuit 58 exposed through opening portion 71, solder paste (76a) is printed with a thickness (W6) of 3±1.5 μm (FIG. 4A). FIG. 4B is a plan view of FIG. 4A. Width (W1) of pad 61 and conductive circuit 58 is 25 μm; length (L1) of pad 61 is 100 μm; and the application length of the solder paste (L2=length of the pad+the length of the conductive circuit left exposed by the solder resist) is 300 μm. Then, a reflow is conducted at 250° C. for 0.5 minute. The solder which is fused during the reflow is formed into a sphere by surface tension. During that time, to make an even more stable sphere, the solder on conductive circuit 58 also agglomerates. Accordingly, solder bump 76 with a half-elliptic profile is formed on pad 61, which is a protruding portion, and thin solder film (76β) is formed on conductive circuit 58 (FIG. 4C). In doing so, printed wiring board 10 is complete. Here, height (H4) of the solder bump is 15 µm, thickness (H5) of solder film (76β) on conductive circuit 58 is 1 µm, and length (L3) of the solder bump becomes (100+α) µm. As for the solder to make solder paste, metal mainly containing Sn/Pb, Sn/Ag, Sn/Sb, Sn/Ag/Cu or the like may be used.

In the following, mounting an IC chip on printed wiring board 10 is described.

Figure 4D:
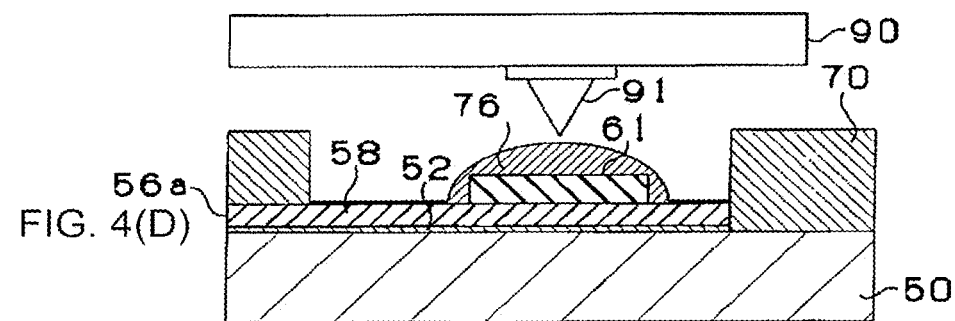
Figure 4E:
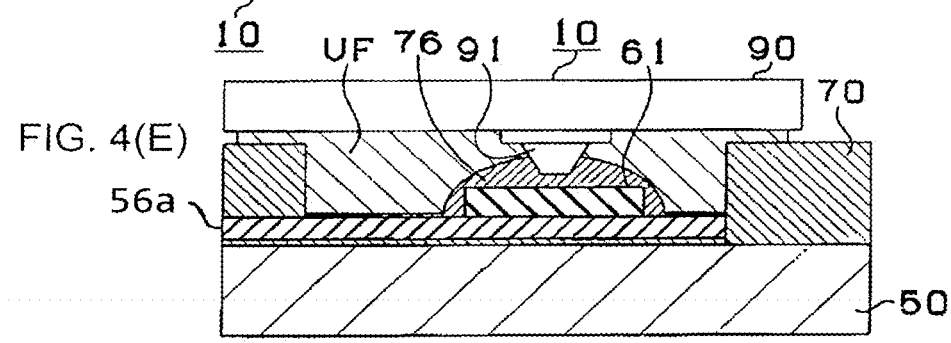

Gold-stud bump 91 of IC chip 90 to be mounted on the printed wiring board is aligned to face pad 61 of printed wiring board 10 (FIG. 4D). Then, IC chip 90 is pressed against printed wiring board 10, gold-stud bump 91 and pad 61 are connected, IC chip 90 is mounted on printed wiring board 10, and underfill (UF) is filled between IC chip 90 and printed wiring board 10 (FIG. 4E). The thickness of pad 61 is preferred to be set lower than solder-resist layer 70. It is possible to form pad 61 to be thicker than solder-resist layer 70; however, since the mounting position of an electronic component rises, the pad is preferred to be set lower than a protective layer from the viewpoint of making a lightweight and thinner type.

In a printed wiring board according to the manufacturing method of the first embodiment, pad 61 is made up of first electrolytic copper-plated film (56a) and second electrolytic copper-plated film 59 with a thickness of 2-10 µm, and is 2-10 µm thicker than conductive circuit 58 made from first electrolytic copper-plated film (56a). Moreover, solder bump 76 with a thickness of 15 µm is formed on pad 61. Thus, when IC chip 90 is pressed against printed wiring board 10 to connect gold-stud bump 91 and solder bump 76 of pad 61, IC chip 90 does not come in contact with solder-resist layer 70. Accordingly, sufficient pressure may be exerted to enhance connection reliability between gold-stud bump 91 and solder bump 76 of pad 61.

Furthermore, since the width of pad (61) is the same as that of conductive circuit (58), it is not necessary to distribute conductive circuit (58) away from pad (61) to keep insulation distance from pad (61). Accordingly, fine-pitch conductive circuit (58) may be arranged.

In addition, since the thickness is increased by forming the second plated-metal film on the first plated-metal film, compared with a manufacturing method in which the thickness of the conductive circuit is reduced through etching using an etching resist, side etching will not occur on the pad and conductive circuit. Thus, connection reliability will not decrease in the pad and conductive circuit.

In a printed wiring board according to the manufacturing method of the first embodiment, solder bump 76 is formed on pad 61, which is then connected to gold-stud bump 91. Since the pad is thick, heavy pressure may be exerted when gold-stud bump 91 is pressed against solder bump 76 of pad 61, leading to high connection reliability.

Moreover, in a printed wiring board according to the manufacturing method of the first embodiment, when gold-stud bump 91 is pressed against solder bump 76 of pad 61, even if solder resist layer 70 comes in contact with IC chip 90, connection reliability may be enhanced, since pad 61 is thick and the pressure exerted on gold-stud bump 91 is heavy.

Since thin solder film (76β)is coated on conductive circuit 58 left exposed by the solder-resist layer, solder film (76β) will not cross over solder-resist 70 to cause a solder bridge between portions of solder.

Second Embodiment

A method for forming printed wiring board 10 according to the second embodiment of the present invention is described with reference to FIGS. 5-7.

Figure 5A:
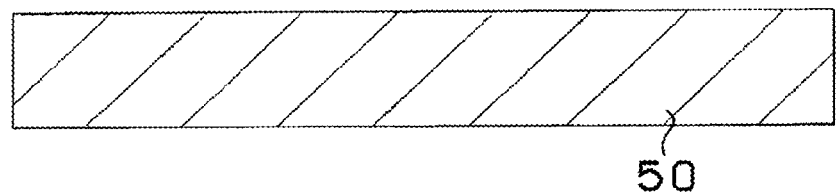
FIGS. 5(A)-5(D) are views showing the steps of a method for manufacturing a printed wiring board according to the second embodiment.
Figure 5B:
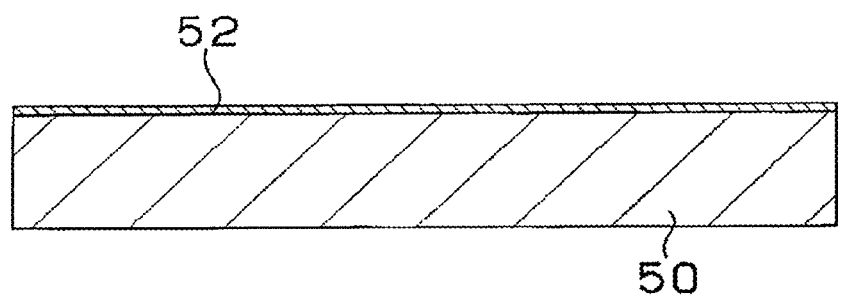

(1) On insulation layer 50 made of resin (FIG. 5A), metal film 52 made of copper or the like is formed (FIG. 5B). Such metal film may be formed by electroless copper plating. Here, instead of forming plated-metal film, metal foil may be laminated.

Figure 5C:
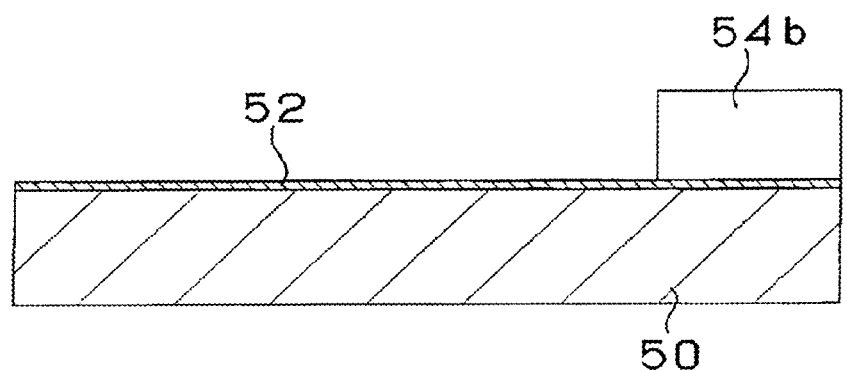
Figure 5D:
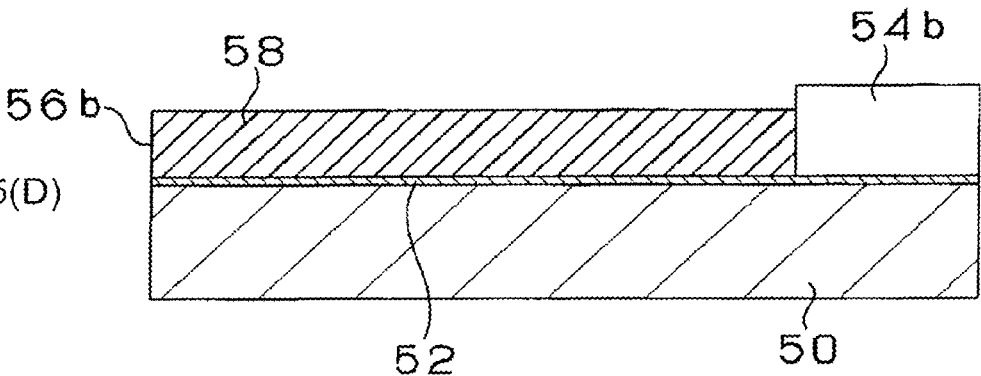

(2) Plating resist (54b) for forming a pad and conductive circuit is formed on metal film 52 (FIG. 5C). Then, the substrate is immersed in an electrolytic plating solution, and an electrical current is passed through metal film 52. Accordingly, electrolytic copper-plated film (56b) with a thickness of 18-25 µm is formed in the area where plating resist is not formed (FIG. 5D).

Figure 6A:
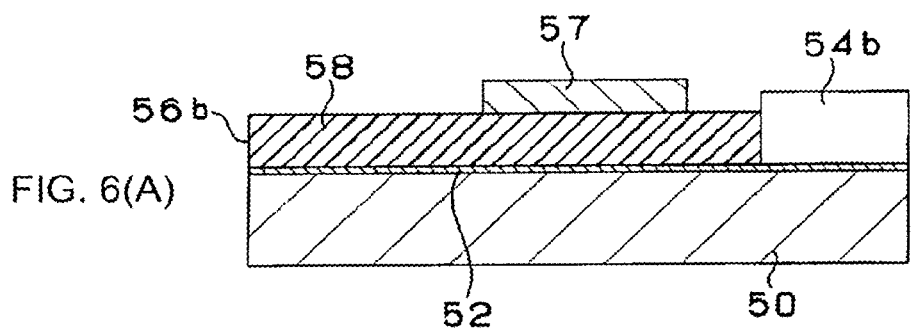
FIGS. 6(A)-6(E) are views showing the steps of a method for manufacturing a printed wiring board according to the second embodiment.
Figure 6B:
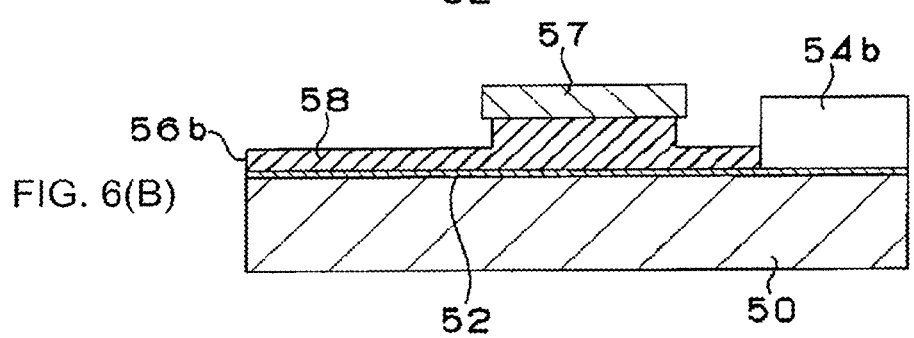

(3) Etching resist 57 is formed on the area of electrolytic copper-plated film (56b) that will become a pad (FIG. 6A). The substrate is immersed in an etchant, and portions of the surface of electrolytic copper-plated film 56 where etching resist 57 is not formed are etched away by a thickness of 2-10 µm (FIG. 6B). The resultant portions will become conductive circuit.

Figure 6C:
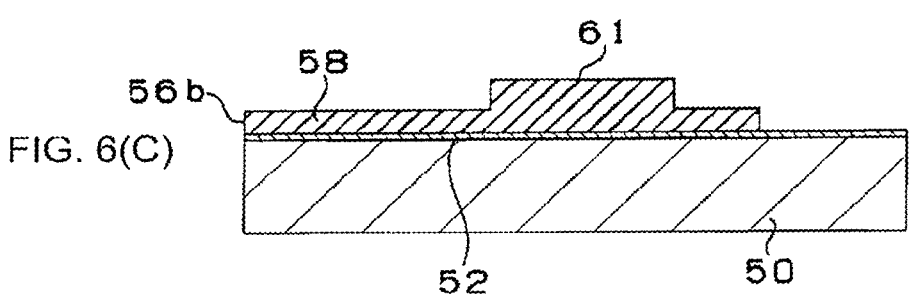
Figure 6D:
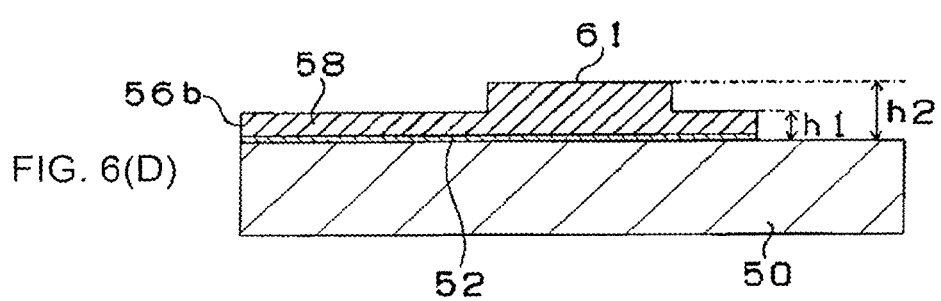

(4) Plating resist (54b) and etching resist 57 are removed and the following are formed: conductive circuit 58 made from the portions of electrolytic copper-plated film (56b) which were etched by a thickness of 2-10 µm, and pad 61 made from the portion of electrolytic copper-plated film (56b) which was not etched (FIG. 6C). Then, metal film 52 under plating resist (54b) is removed by etching (FIG. 6D). By doing so, conductive circuit 58 with thickness (h1) of 15 µm and pad 61 with thickness (h2) in the range of 18-25 µm are formed.

Figure 6E:
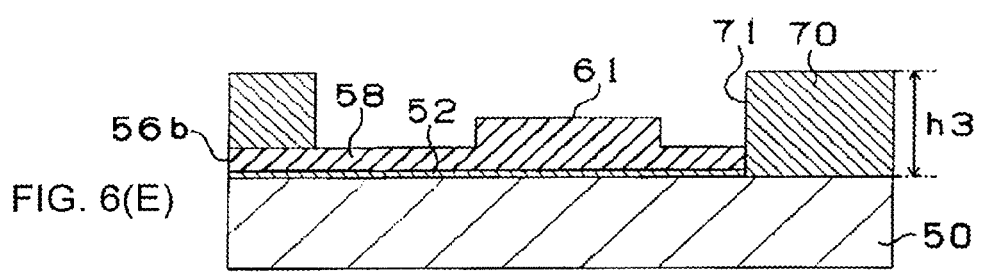

(5) Opening portion 71 exposing pad 61 is arranged on insulation layer 50, and solder resist layer 70 with thickness (h3) in the range of 25-35 µm is formed (FIG. 6E).

Figure 7A:
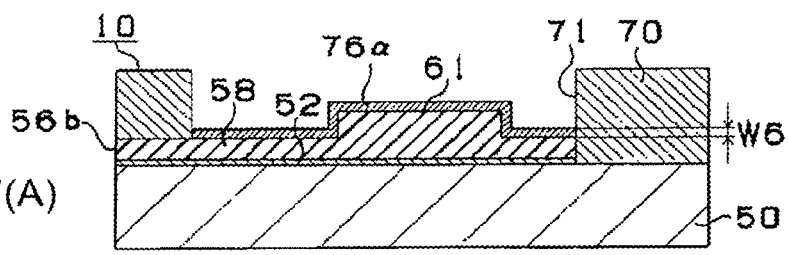
FIGS. 7(A)-7(E) are views showing the steps of a method for manufacturing a printed wiring board according to the second embodiment.
Figure 7B:
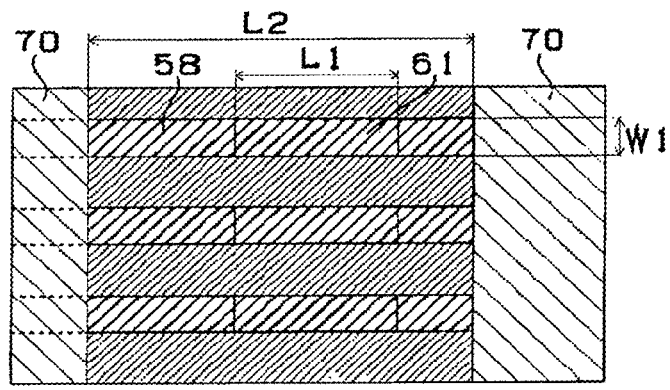
Figure 7C:
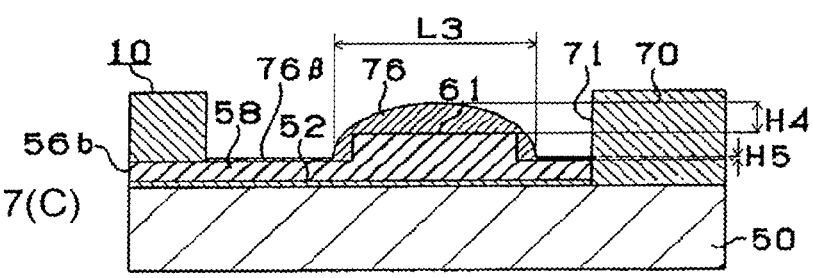

(6) On pad 61 and conductive circuit 58 exposed through opening portion 71, solder paste (76α) is printed with a thickness (W6) of 3±1.5 µm (FIG. 7A). FIG. 7B is a plan view of FIG. 7A. Width (W1) of pad 61 and conductive circuit 58 is 25 µm; length (L1) of pad 61 is 100 µM; and the application length of the solder paste (L2=length of the pad+the length of the conductive circuit left exposed by the solder resist) is 300 µm. Then, a reflow is conducted at 250° C. for 0.5 minute. The solder which is fused during the reflow is formed into a sphere by surface tension. During that time, to make an even more stable sphere, the solder on conductive circuit 58 also agglomerates. Accordingly, solder bump 76 with a half-elliptic profile is formed on pad 61, which is a protruding portion, and thin solder film (76β) is formed on conductive circuit 58 (FIG. 7C). In doing so, printed wiring board 10 is complete. Here, height (H4) of the solder bump is 15 µm, thickness (H5) of solder film (76β) on conductive circuit 58 is 1 µm, and length (L3) of the solder bump becomes 100+αµm. It is possible to form a metal layer using at least a metal selected from among Ni, P, Au, Sn, Pd, Ag and Pt, and then forming solder film before printing solder paste (76α) on pad 61 and conductive circuit 58 exposed through opening portion 71.

Next, mounting an IC chip on printed wiring board 10 is described.

Figure 7D:
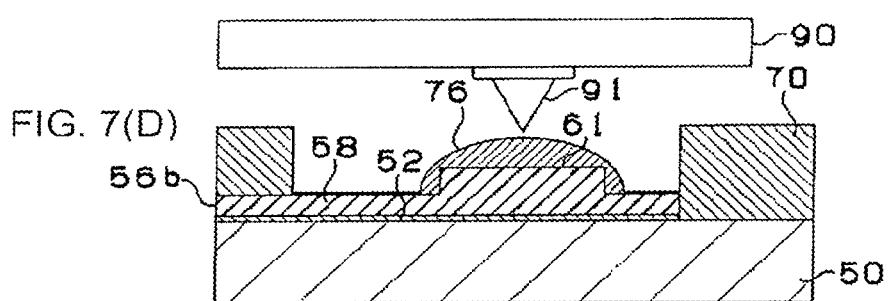
Figure 7E:
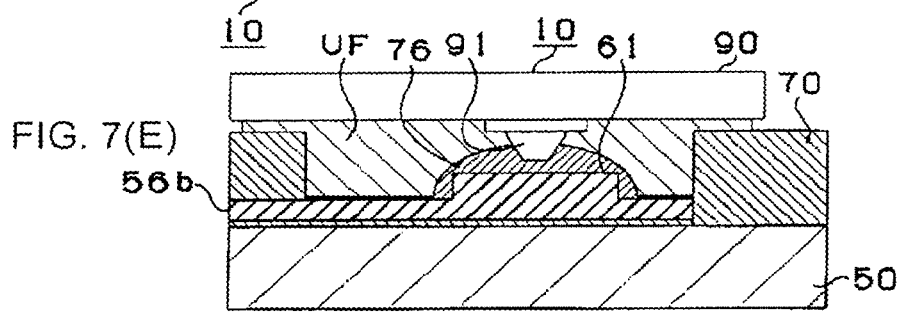

Gold-stud bump 91 of IC chip 90 to be mounted on the printed wiring board is aligned to face pad 61 of printed wiring board 10 (FIG. 7D). Then, IC chip 90 is pressed against printed wiring board 10, gold-stud bump 91 and pad 61 are connected, IC chip 90 is mounted on printed wiring board 10, and underfill (UF) is filled between IC chip 90 and printed wiring board 10 (FIG. 7E).

In printed wiring board 10 according to the manufacturing method of the second embodiment, pad 61 is thicker than conductive circuit 58, whose thickness is etched away by 2-10 μm. Moreover, solder bump 76 with a thickness of 15 μm is formed on pad 61. Thus, when IC chip 90 is pressed against printed wiring board 10 to connect gold-stud bump 91 and solder bump 76 of pad 61, IC chip 90 does not come in contact with solder-resist layer 70, and connection reliability is enhanced between gold-stud bump 91 and solder bump 76 of pad 61 by exerting sufficient pressure.

Furthermore, the width of pad 61 is the same as the width of conductive circuit 58. Thus, it is not necessary to distribute conductive circuit 58 away from pad 61 to keep insulation distance from pad 61. Thus, fine-pitch conductive circuit 58 may be arranged.

Also, during the etching, because plating resist (54a) remains on the side surface of pad 61 and the side surface of conductive circuit 58, side etching will not occur on pad 61 and conductive circuit 58. Thus, reliability will not decrease in the pad and wiring, compared with a manufacturing method in which side etching will occur during etching using an etching resist to reduce the thickness of the wiring.

Figure 10A:
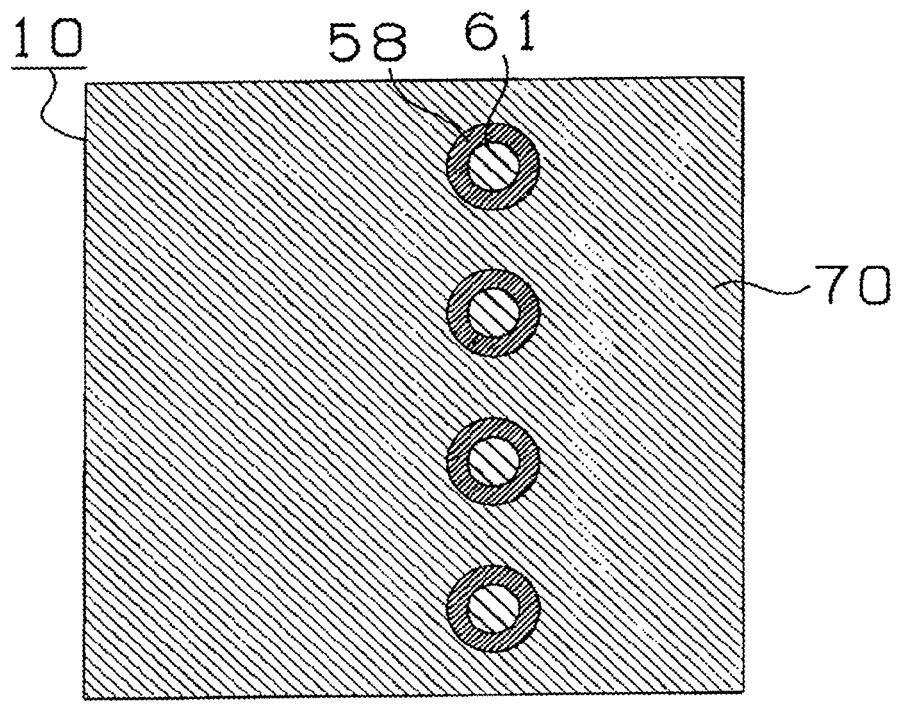
FIGS. 10(A)-10(B) are plan views showing modified examples of a printed wiring board according to the present invention.
Figure 10B:
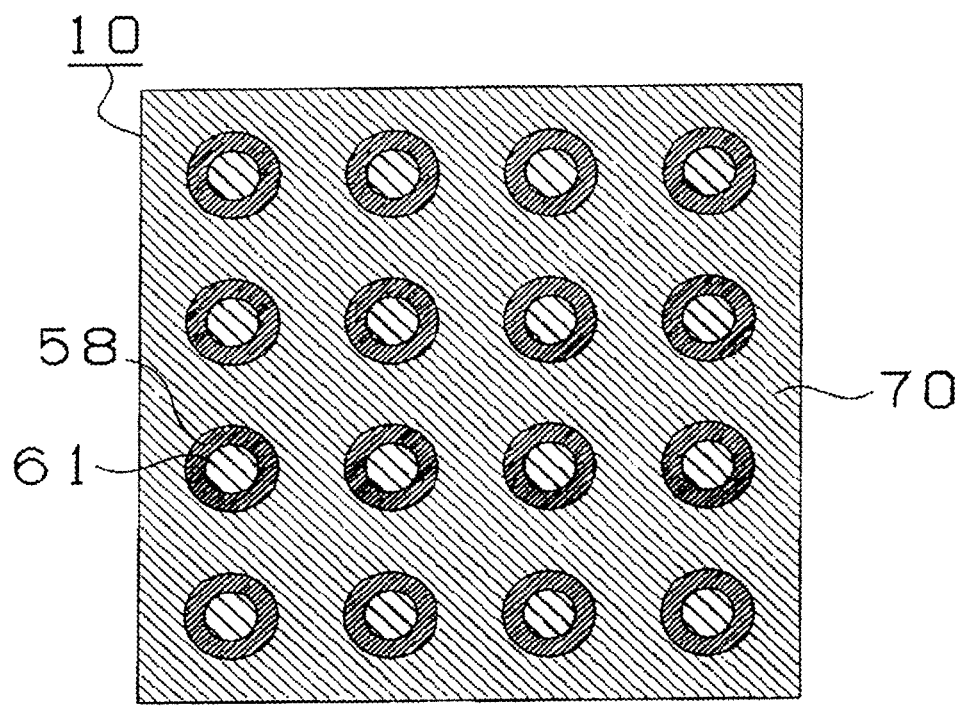

In printed wiring boards according to the first and second embodiments, multiple rectangular pads 61 are exposed through opening 71 arranged in solder-resist layer 70. However, as shown in FIG. 10A, pads 61 with a substantially circular shape may be formed. Also, as shown in FIG. 10B, only pads may be formed in a grid configuration and exposed through the solder resist, which is higher than such pads.

Furthermore, as a modified example of the first embodiment, the following method may also be employed. FIG. 8A is a top view showing second plating resist 55 formed on printed wiring board 10. FIGS. 8B and 8C are cross-sectional views taken respectively from the (B1-B1) line and (A1-A1) line in FIG. 8A. Second plating resist 55 is formed to be narrower than the width of the first electrolytic copper-plated film. In such a case, pad 61 formed later will be set to be narrower than conductive circuit 58 both lengthwise and crosswise as shown in FIG. 8D. Then, solder bump 76 is formed on pad 61 by printing solder paste and conducting a reflow (FIG. 8E). In such a modified example, solder bump 76 is formed on pad 61, which has a smaller area than the conductive circuit. Thus, solder bump 76 here has an advantage in that its height may be set higher compared with the first embodiment.

Also, the following may be employed as a modified example of the second embodiment.

Figure 9A:
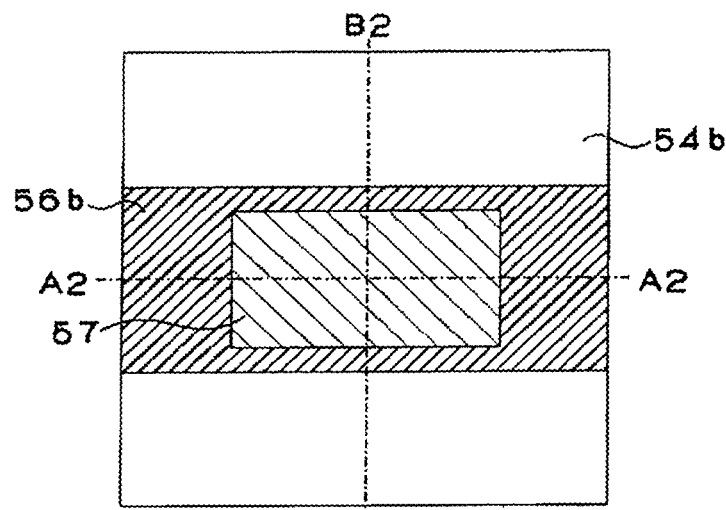
FIGS. 9(A)-9(E) are a top view and cross-sectional views showing a modified example of the multilayer printed wiring board according to the second embodiment.
Figure 9B:
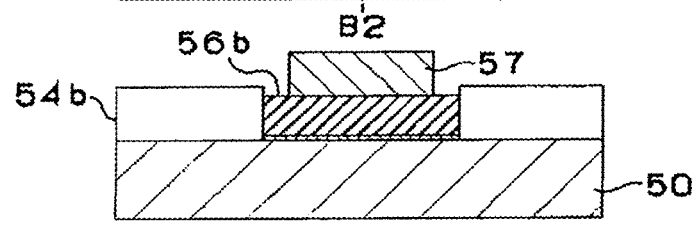
Figure 9C:
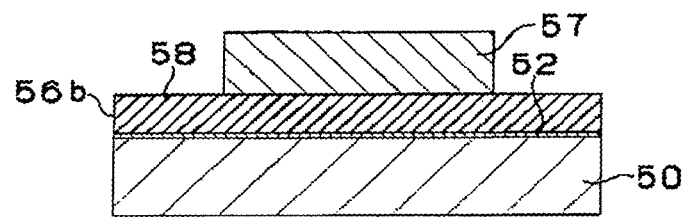
Figure 9D:
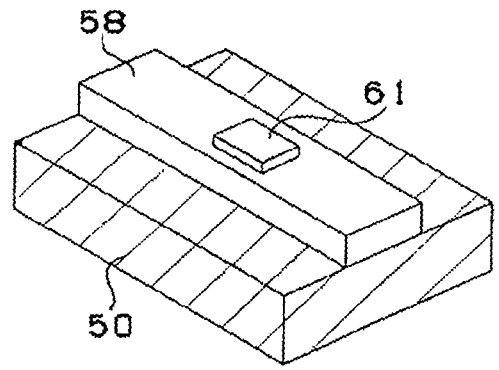
Figure 9E:
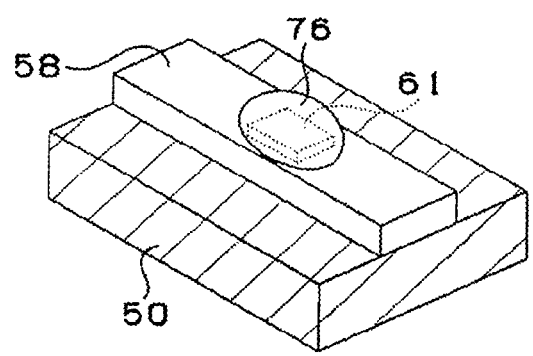

FIG. 9A is a top view showing etching resist 57 formed on the first electrolytic copper-plated film. FIGS. 9B and 9C are cross-sectional views taken respectively from the (B2-B2) line and (A2-A2) line in FIG. 9A. Etching resist 57 is formed to be narrower than the width of the first electrolytic copper-plated film. In such a case, pad 61 formed later will be set to be narrower than conductive circuit 58 both lengthwise and crosswise as shown in FIG. 9D. Then, solder bump 76 is formed on pad 61 by printing solder paste and conducting a reflow (FIG. 9E). In such a modified example, solder bump 76 is formed on pad 61, which has a smaller area than the conductive circuit. Thus, solder bump 76 here has an advantage in that its height may be set higher compared with the second embodiment.

Third Embodiment

A method for manufacturing printed wiring board 10 according to the third embodiment of the present invention is described with reference to FIGS. 11.

Figure 11A:
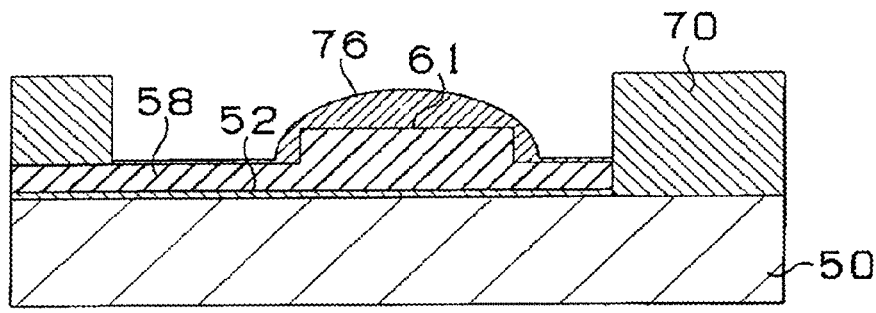
FIGS. 11(A)-11(D) are views showing the steps of a method for manufacturing a printed wiring board according to the third embodiment.
Figure 11B:
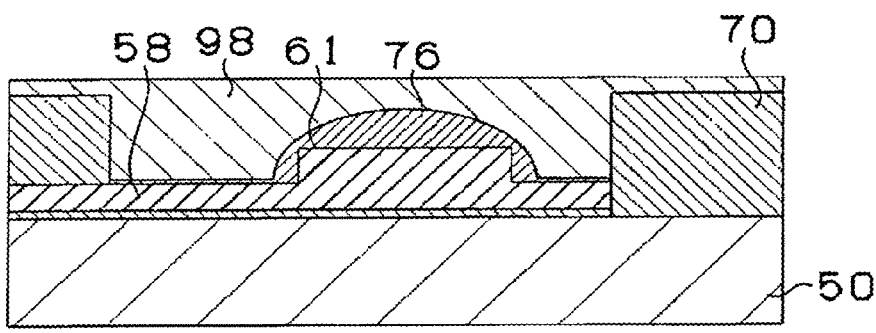

Using steps (1)-(4) of the first embodiment or steps (1)-(4) of the second embodiment, wiring 58 and pad 61, which is set to be 2-10 μm thicker than the wiring, and solder bump 76 with a height of 15 μm are formed on insulation layer 50 (FIG. 11A). Then, anisotropic conductive film (ACF) 98, containing conductive particles made of metal or the like in resin film, is arranged on insulation layer 50, and printed wiring board 10 is completed (FIG. 11B).

Figure 11C:
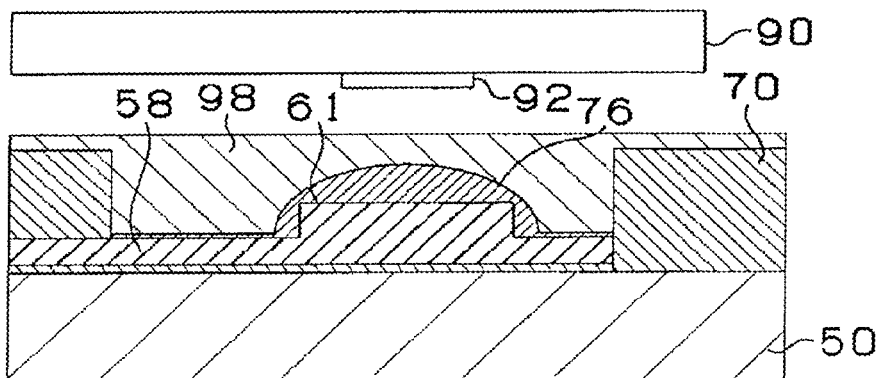
Figure 11D:
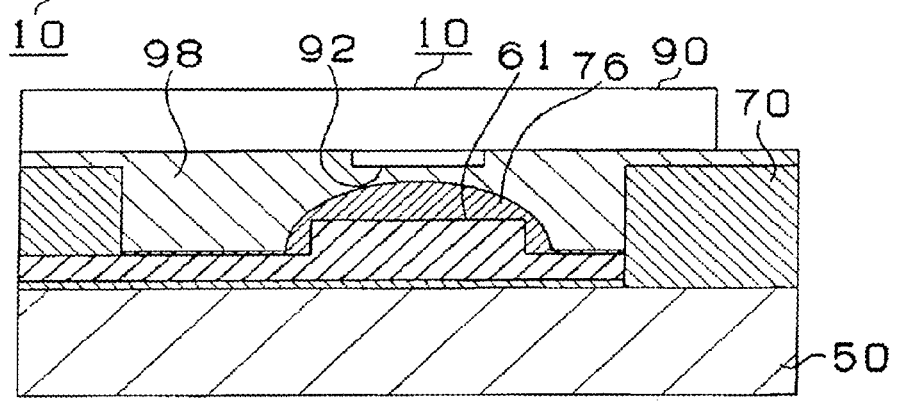

Bump 92 of IC chip 90 to be mounted on a printed wiring board is aligned to face pad 61 of printed wiring board 10 (FIG. 11C). Then, IC chip 90 is pressed against printed wiring board 10, bump 92 and pad 61 are connected by means of ACF 98, and IC chip 90 is mounted on printed wiring board 10 (FIG. 11D).

In printed wiring board 10 of the third embodiment, since pad 61 is thicker than wiring 58 and solder bump 76 is further formed, only pad 61 makes connection with bump 92 by means of anisotropic conductive film (ACF) 98 without causing short-circuiting in wiring 58.

EXAMPLES

First Example

Figure 19:
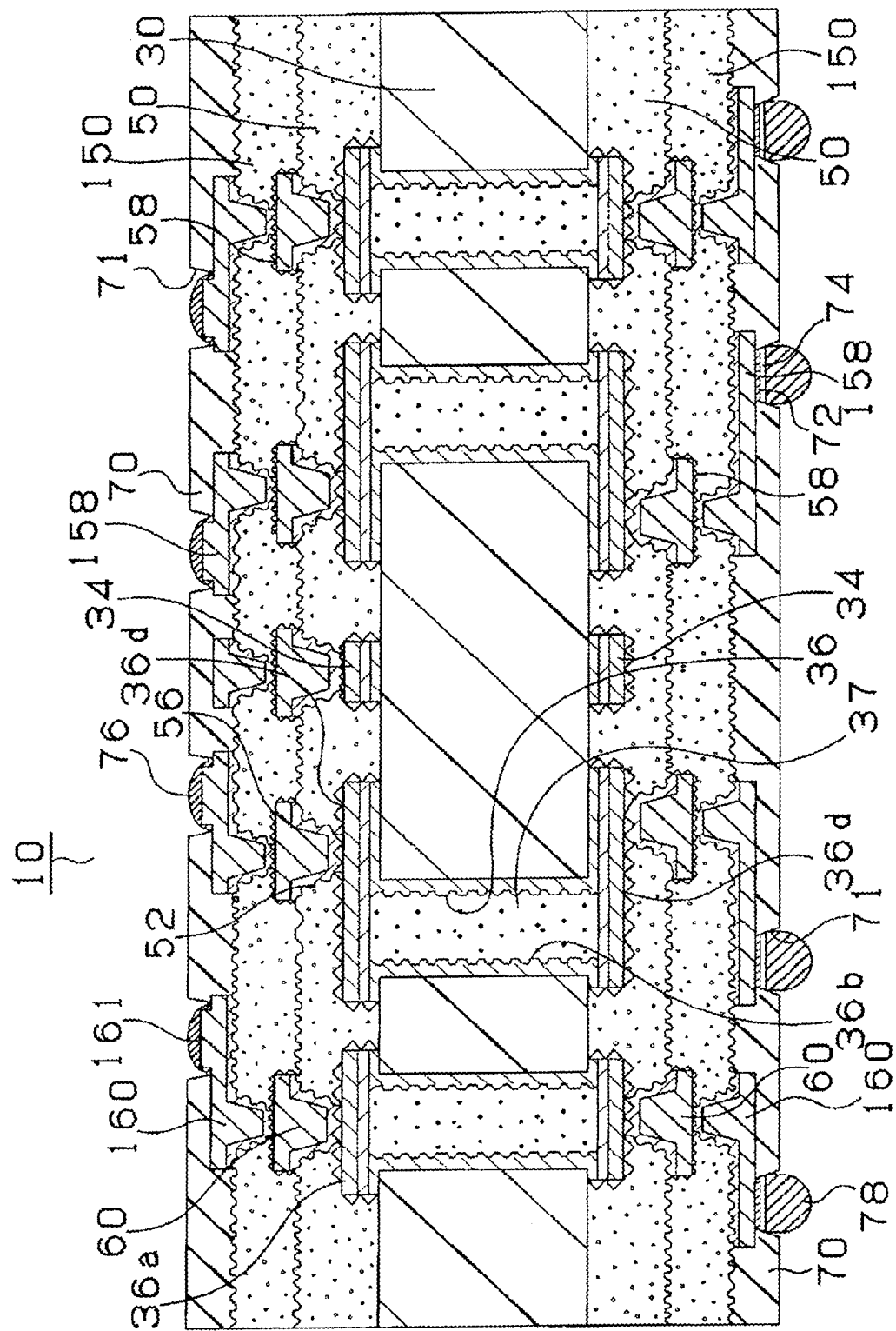
FIG. 19 is a cross-sectional view of a multilayer printed wiring board according to the first example.
Figure 20:
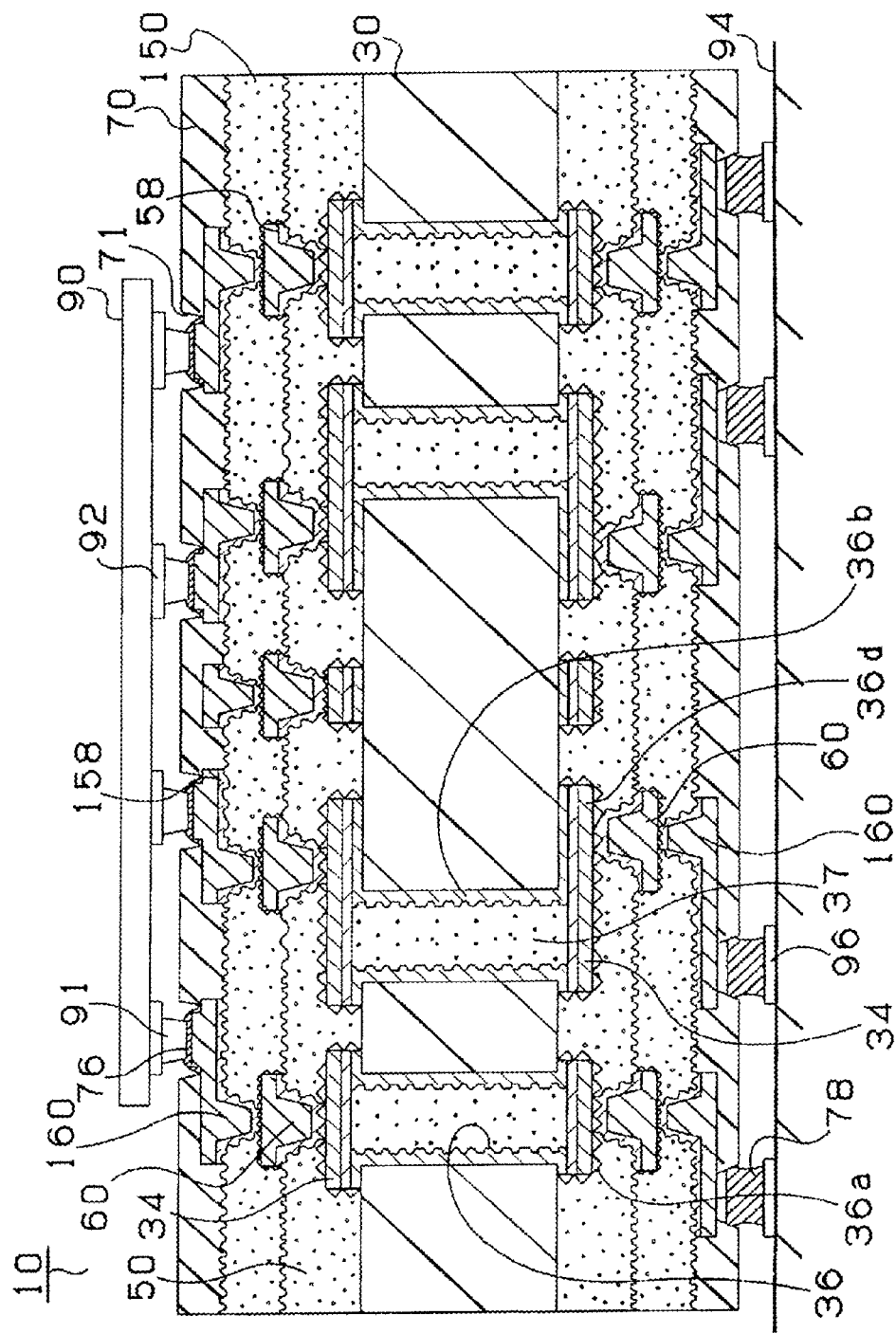
FIG. 20 is a cross-sectional view showing a state in which an IC chip is mounted on a multilayer printed wiring board according to the first embodiment.

The structure of built-up multilayer printed wiring board 10 according to the first example of the present invention is described with reference to FIGS. 12-20. FIG. 19 is a cross-sectional view showing multilayer printed wiring board 10, and FIG. 20 is a view showing a state in which IC chip 90 is mounted on multilayer printed wiring board 10 shown in FIG. 19, which is further mounted on daughterboard 94. As shown in FIG. 19, in multilayer printed wiring board 10, conductive circuits 34 are formed on the surfaces of core substrate 30. The front and back surfaces of core substrate 30 are connected by means of through-holes 36. Through-holes 36 are made up of plated cover layers (36a, 36d) which form through-hole lands and of side-wall conductive layers (36b). Resin filler 37 is filled in the interiors surrounded by side-wall conductive layers (36b). Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuit 158, and solder bumps 76 are formed on pads 161. Solder resist layers 70 are formed on resin insulation layers 150. Pads 161 are exposed through opening portions 71 of upper-side solder resist layer 70; and bumps 78 are formed in lower-side opening portions 71.

As shown in FIG. 20, solder bumps 76 of upper-side pads 161 of multilayer printed wiring board 10 are connected to bumps 92 of IC chip 90 by means of gold-stud bumps 91. Meanwhile, lower-side solder bumps 78 are connected to lands 96 of daughterboard 94.

Next, a method for manufacturing multilayer printed wiring board 10 described with reference to FIG. 20 is described by referring to FIGS. 12-19.

Figure 12A:
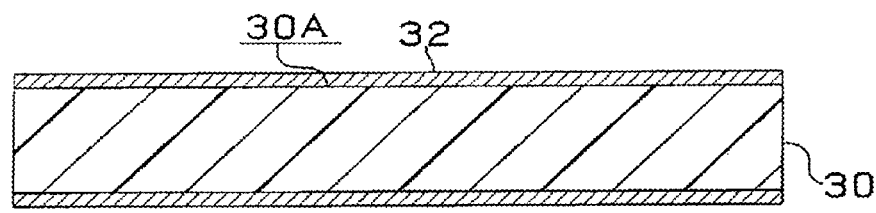
FIGS. 12(A)-12(D) are views showing the steps of a method for manufacturing a multilayer printed wiring board according to the first example of the present invention.
Figure 12B:
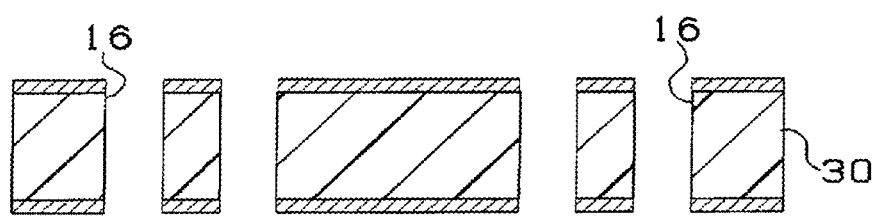
Figure 12C:
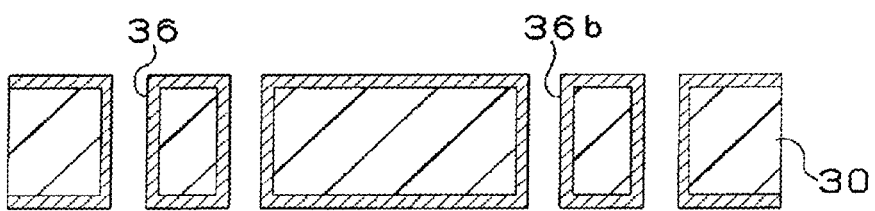

(1) Copper-clad laminate (30A) was prepared as a starting material. The copper clad-laminate was made by laminating copper foil 32 with a thickness of 5-250 μm on both surfaces of insulative substrate 30 made of glass-epoxy resin or bismaleimide triazine (BT) resin with a thickness of 0.2-0.8 mm (FIG. 12A). First, by drilling the copper-clad laminate, penetrating holes 16 were formed (FIG. 12B). Then, side-wall conductive layers (36b) of through-holes 36 were formed by performing electroless plating and electrolytic plating (see later-described plating solution and conditions (steps (13) and (15)) (FIG. 12C). The opening diameter of penetrating holes 16 was set at Φ0.1-0.25 mm by drill selection, and the pitch was set at 0.15-0.575 mm.

Figure 12D:
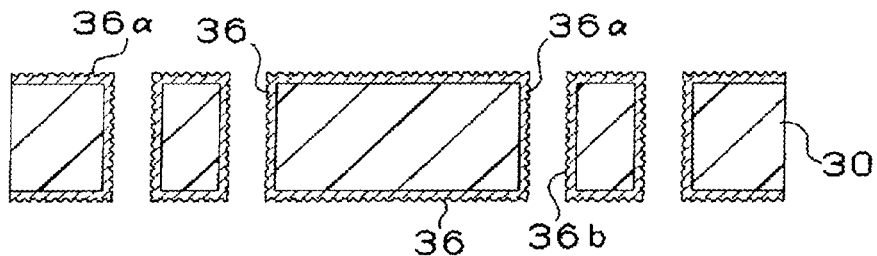

(2) Substrate 30 with through holes 36 was washed with water and dried, a black-oxide treatment was conducted using a solution containing NaOH (10 g/l), NaClO$_2$ (40 g/l) and Na$_3$PO$_4$ (6 g/l) as a black-oxide bath (oxidation bath), followed by a reduction treatment using a solution containing NaOH (10 g/l) and NaBH$_4$ (6 g/l) as a reduction bath. Accordingly, roughened surfaces (36a) were formed on side-wall conductive layers (36b) of through-holes 36 and on the surfaces of the substrate (FIG. 12D).

Figure 13A:
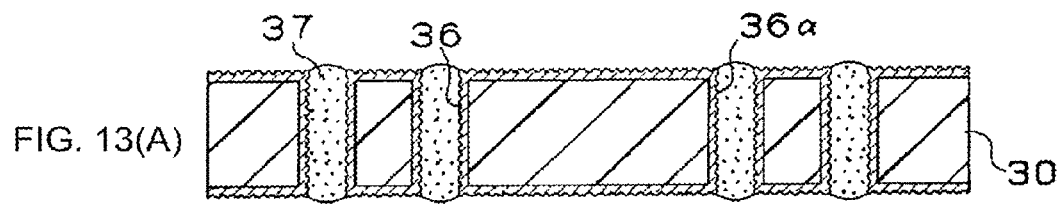
FIGS. 13(A)-13(E) are views showing the steps of a method for manufacturing a multilayer printed wiring board according to the first example of the present invention.
Figure 13B:
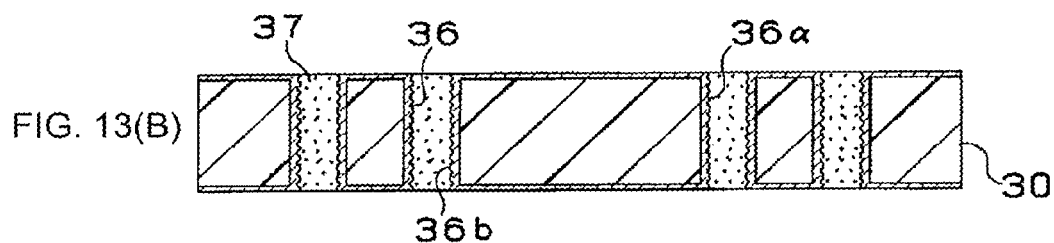
Figure 13C:
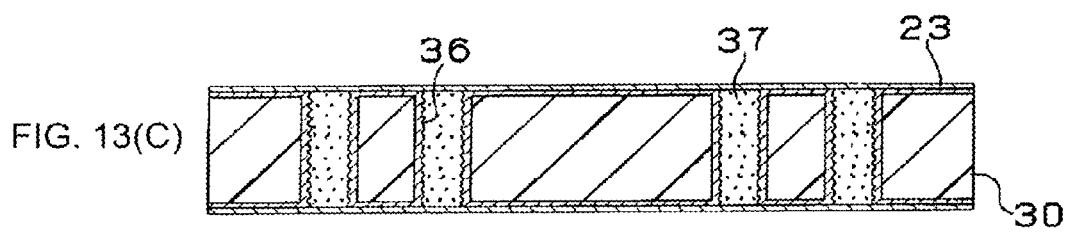
Figure 13D:
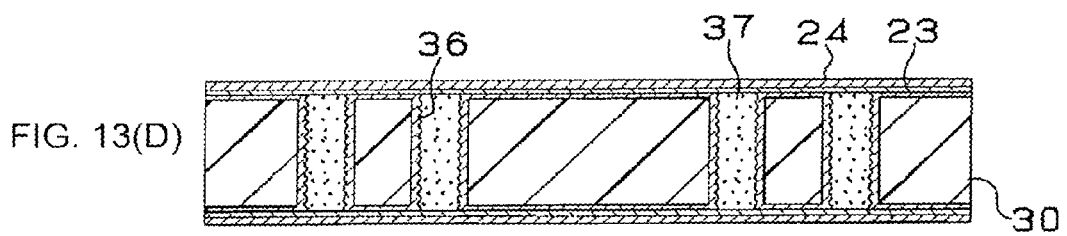
Figure 13E:
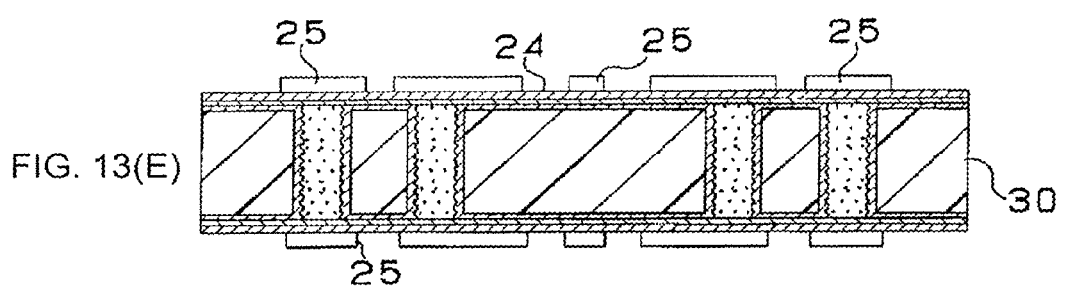

(3) Next, filler 37 (non-conductive copper paste padding, brand name: DD paste, made by Tatsuta Electric Wire & Cable, Co., Ltd.) containing copper particles with an average particle diameter of 10 μm was filled in through-holes 36 by screen printing, dried and cured (FIG. 13A). A mask with openings corresponding to through-hole portions was placed on the substrate, and the paste was applied by printing to fill the through-holes. After that, the paste was dried and cured.

In the following, filler 37 bulging from through-holes 36 was removed by belt-sander polishing using #600 belt sanding paper (made by Sankyo-Rikagaku Co., Ltd.). Then, buff polishing to remove scratches from such belt sanding was conducted to level the surfaces of substrate 30 (see FIG. 13B). In doing so, substrate 30 was obtained where side-wall conductive layers (36b) of through-holes 36 and resin filler 37 were firmly adhered by means of roughened layer (36a).

(4) On the surfaces of substrate 30 leveled in step (3), palladium catalyst (made by Atotech) was applied and electroless copper plating was performed. Accordingly, electroless copper-plated films 23 with a thickness of 0.6 μm were formed (see FIG. 13C).

(5) Next, electrolytic copper plating was performed under the following conditions to form electrolytic copper-plated films 24 with a thickness of 15 μm. The portions that will become conductive circuits 34 were thickened, and the portions that will become plated cover layers (through-hole lands) to cover filler 37 filled in through-holes 36 were formed (FIG. 13D).
[Electrolytic Plating Solution]
sulfuric acid 180 g/l
copper sulfate 80 g/l
additive (brand name: Cupracid GL, made by Atotech Japan)
1 ml/l
[Electrolytic Plating Conditions]
current density 1 A/dm$^2$
time 30 minutes
temperature room temperature (6) On both surfaces of substrate 30 where portions that will become conductive circuits and plated-cover layers were formed, commercially available photosensitive dry film was laminated, and a patterned mask was placed on the film, which was then exposed to light at 100 mJ/cm$^2$ and developed with a 0.8% sodium carbonate solution. Accordingly, etching resists 25 with a thickness of 15 μm were formed (see FIG. 13E).

(7) Next, portions of plated-metal films (23, 24) and copper foil 32 where etching resist 25 was not formed were dissolved and removed by an etchant mainly containing copper (II) chloride. Then, etching resists 25 were removed by a 5% KOH solution. Accordingly, independent circuits 34 and plated-cover layers (36a, 36d) covering filler 37 were formed (see FIG. 14A). This process is a so-called tenting method.

(8) Next, roughened layers (34β) were formed on the surfaces of conductive circuit 34 and plated-cover layers (36a, 36d) covering filler 37, using a micro etchant (CZ series) made by Mec Co., Ltd. (FIG. 14B).

(9) On both surfaces of the substrate, resin film (50γ) for interlayer resin insulation layer (brand name ABF-45SH, made by Ajinomoto Fine-Techno Co., Inc.) with a slightly larger size than the substrate was placed and preliminarily pressed under the conditions of pressure 0.45 MPa, temperature 80° C. and pressing time 10 seconds, and cut to size. Then, by laminating the film using vacuum laminator equipment under the following conditions, resin insulation layers 50 were formed (FIG. 14C). Namely, the resin film for interlayer resin insulation layer on the substrate was given a final pressing under the conditions of vacuum degree 67 Pa, pressure 0.47 MPa, temperature 85° C. and pressing time 60 seconds, and then thermoset at 170° C. for 40 minutes.

(10) Next, using a CO2 gas laser with a wave length of 10.4 μm, via hole openings 51 were formed in resin insulation layers 50 under the conditions of beam diameter 4.0 mm, top-hat mode, pulse width 3-30 μ sec., mask through-hole diameter 1.0-5.0 mm and number of shots 1-3 (FIG. 14D). The above laser conditions were adjusted so that the bottom diameter of via holes in resin insulation layers 50 would become φ60 μm. As a result, the bottom diameter of the via holes formed on plated-cover layers (36a, 36d) was made Φ60 μm.

Figure 15A:
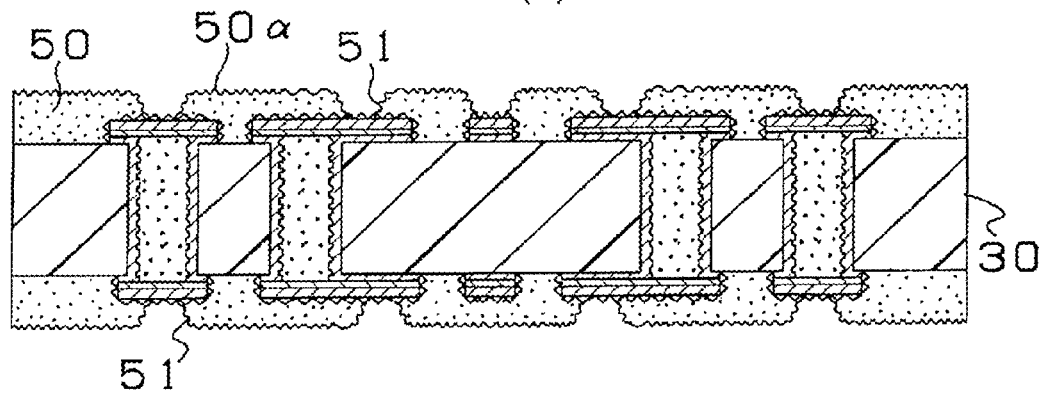
FIGS. 15(A)-15(C) are views showing the steps of a method for manufacturing a multilayer printed wiring board according to the first example of the present invention.
Figure 15B:
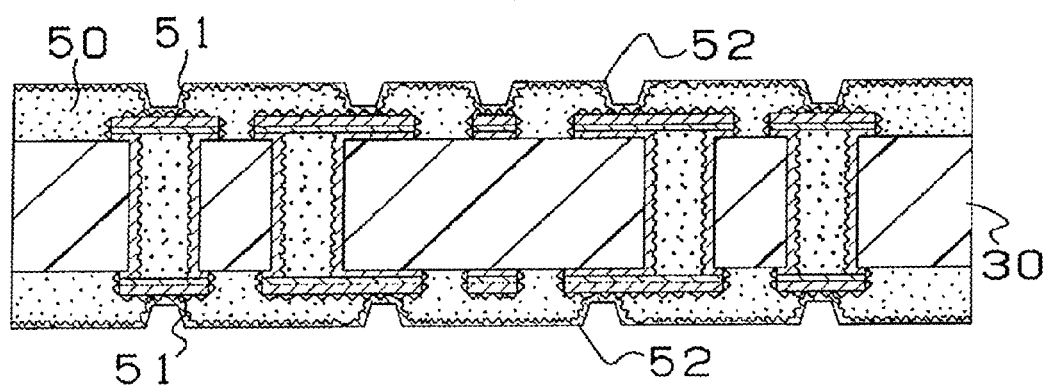

(11) The substrate with filled-via openings 51 was immersed for 10 minutes in an 80° C. solution containing permanganic acid 60 g/l, and epoxy-resin particles residing on the surfaces of resin insulation layers 50 were dissolved and removed. Accordingly, roughened surfaces (50a) were formed on the surfaces of resin insulation layers 50 including the inner walls of filled-via openings 51 (FIG. 15A).

(12) Next, after the above treatments, the substrate was immersed in a neutralizer (made by Shipley Company, LLC) and was washed with water. Furthermore, by applying palladium catalyst on the roughened surfaces (roughened depth 3 pm) of the substrate, catalyst nuclei were adhered to the surfaces of the resin insulation layers and the inner-wall surfaces of the filled-via openings. Namely, the substrate was immersed in a catalytic solution containing palladium chloride (PbC$_{12}$) and stannous chloride (SnC$_{12}$), and the catalyst was adhered to the surfaces through deposition of palladium metal.

(13) Next, the substrate with applied catalyst was immersed in an electroless copper plating solution (Thru-Cup PEA) made by C. Uyemura & Co., Ltd. to form electroless copper-plated film with a thickness of 0.3-3.0 μm on the entire roughened surfaces. Accordingly, the substrate was obtained where electroless copper-plated film 52 was formed on the surfaces of resin insulation layers 50 including the inner walls of via-hole opening 51 (FIG. 15B).
[Electroless Plating Conditions]
solution temperature at 34° C. for 45 minutes

Figure 15C:
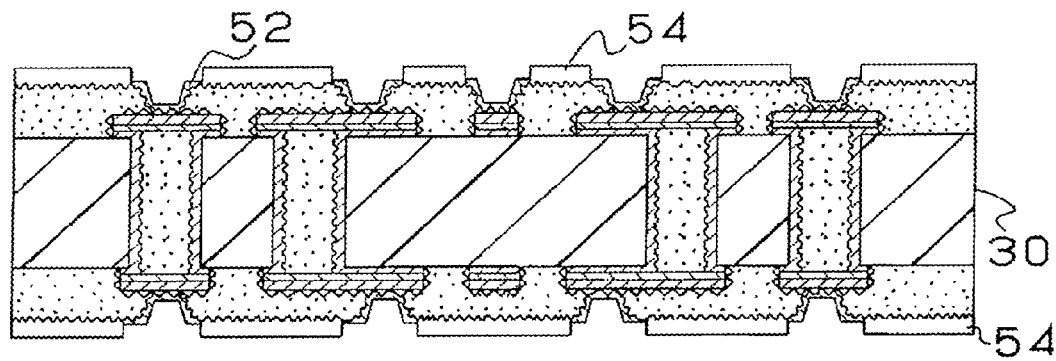

(14) On the substrate having electroless copper-plated film 52, commercially available photosensitive dry film was laminated, and a mask was placed on the film, which was then exposed to light at 110 mJ/cm$^2$ and developed with a 0.8% sodium carbonate solution. Accordingly, plating resists 54 with a thickness of 25 μm were formed (FIG. 15C).

(15) Then, after substrate 30 was cleansed with 50° C. water to degrease it and washed with 25° C. water, the substrate was further cleansed with sulfuric acid. Then, electrolytic plating was performed under the following conditions to form electrolytic plated-metal film 56 (FIG. 16A).

[Electrolytic Plating Solution]
sulfuric acid 2.24 mol/l
copper sulfate 0.26 mol/l
additive 19.5 ml/l
leveling agent 50 mg/l
polishing agent 50 mg/l
[Electrolytic Plating Conditions]
current density 1 A/dm$^2$
time 70 minutes
temperature 22±2° C.

(16) Furthermore, after plating resists 54 were removed using a 5% KOH solution, electroless plated-metal film under the plating resists was removed by etching using a mixed solution of sulfuric acid and hydrogen peroxide. Accordingly, independent conductive circuits 58 and filled vias 60 were formed (FIG. 16B).

(17) Next, by conducting the same treatment as in above step (4), roughened surfaces (58a) were formed on the surfaces of conductive circuits 58 and filled vias 60. The thickness of upper-layer conductive circuits 58 was 15 µm (FIG. 16C). However, the thickness of upper-layer conductive circuits may be set anywhere between 5 and 25 µm.

(18) By repeating steps (9)-(15), conductive circuits 158 and filled vias 160 made of electroless plated-metal film 152 and electrolytic plated-metal film 156 were formed in areas of upper-layer resin insulation layers 150 where plating resist 154 was not formed (FIG. 16D).

Figure 17A:
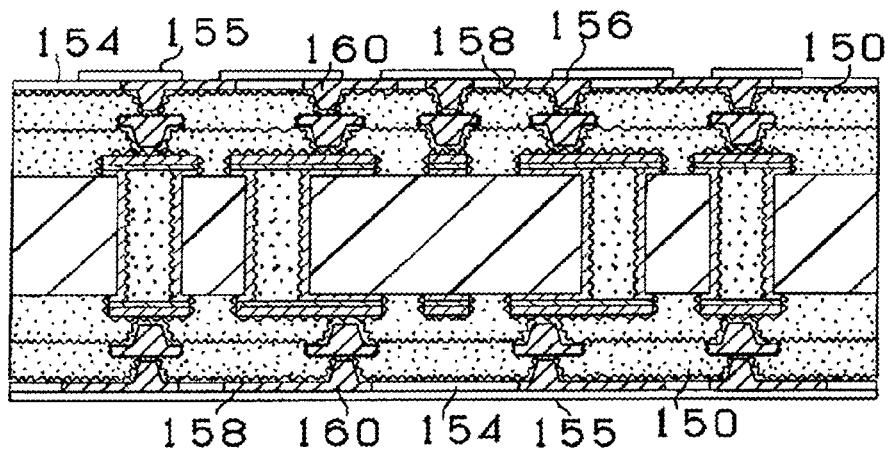
FIGS. 17(A)-17(C) are views showing the steps of a method for manufacturing a multilayer printed wiring board according to the first example of the present invention.

(19) Second plating resist 155 for forming pads was formed on copper-plated film 156 which will later become wiring patterns (FIG. 17A).

Figure 17B:
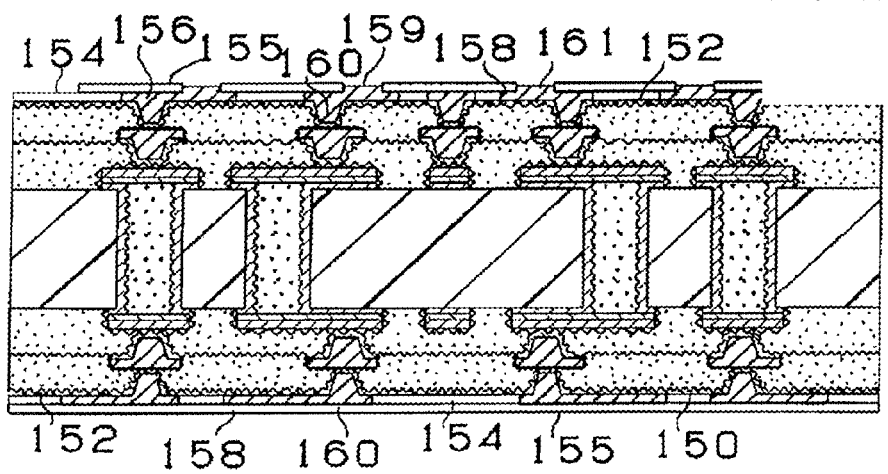

(20) The substrate was immersed in an electrolytic plating solution to form electrolytic copper-plated film 159 with a thickness of 2-10 µm on copper-plated film 156 in areas where second plating resist 155 was not formed (FIG. 17B).

Figure 17C:
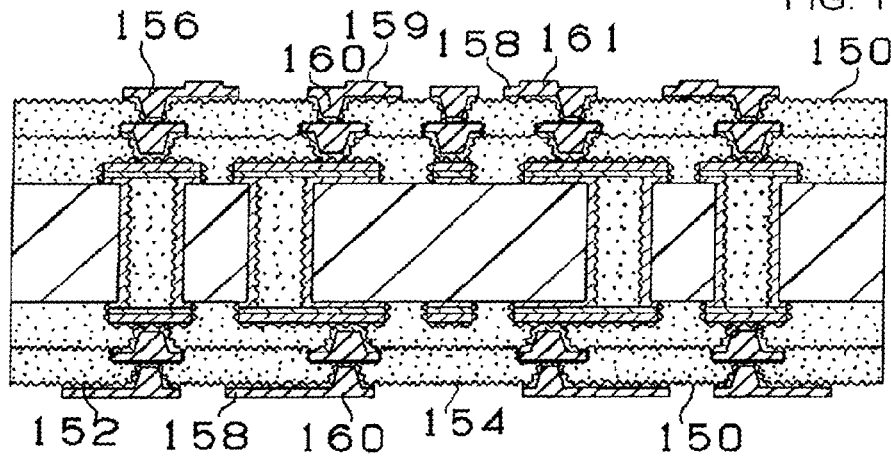

(21) Plating resists 154 and second plating resists 155 were removed, and pads 161 made from copper-plated film 159 were formed on wiring 158, which was made from copper-plated film 156. Then, metal film 152 under plating resists 154 was removed by etching (FIG. 17C).

(22) Next, on both surfaces of a multilayer wiring substrate, a commercially available solder-resist composition (70) was applied to be 25-35 µm thick, which was then dried at 70° C. for 20 minutes and at 70° C. for 30 minutes. Then, a 5-mm thick photomask with a pattern of solder-resist openings was adhered to solder resist layers 70, which were then exposed to ultraviolet rays at 1000 mJ/cm$^2$ and developed using a DMTG solution. Accordingly, openings 71 were formed with a diameter of 200 µm (FIG. 18A). In addition, heat treatments were conducted at 80° C. for an hour, 100° C. for an hour, 120° C. for an hour and 150° C. for three hours to cure the solder resist layers. Accordingly, solder-resist pattern layers having openings are formed with a thickness of 20-30 µm.

(23) Next, regarding the substrate with solder-resist layers 70, resist film was formed on the upper-side resist layer, and nickel-plated layer 72 and gold-plated layer 74 were formed in opening portions 71 of the lower-side solder-resist layer. Here, the substrate was immersed for 20 minutes in an electroless nickel plating solution of pH=4.5 containing nickel chloride ($2.3 \times 10^{-1}$ mol/l), sodium hypophosphite ($2.8 \times 10^{-1}$ mol/l) and sodium citrate ($1.6 \times 10^{-1}$ mol/l); and a 0.5 µm-thick nickel-plated layer 72 was formed in opening portions 71. Furthermore, the substrate was immersed for 7.5 minutes at 80° C. in an electroless gold plating solution containing gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l). Accordingly, a 0.03 µm-thick gold-plated layer 74 was formed on nickel-plated layer 72 (FIG. 18B). Other than a nickel-gold layer, a single layer of tin or a noble metal layer (gold, silver, palladium, platinum, lead, zinc or the like) may be formed.

(24) After that, Sn/Ag solder paste (76α) was printed to be (3+1.5) µm thick in openings 71 of the upper-side solder-resist layer; and tin-antimony solder paste 77 was printed in openings 71 of the lower-side solder-resist layer (FIG. 18C).

(25) After reflowing at 200° C., solder bumps 76 were formed on upper-side pads 161 and solder bumps 78 were formed in lower-side openings 71. Accordingly, a multilayer printed wiring board was manufactured (FIG. 19).

In the following, mounting an IC chip on multilayer printed wiring board 10 and further mounting the wiring board on a daughterboard are described.

Gold-stud bumps 91 of IC chip 90 to be mounted on the multilayer printed wiring board are aligned to face pads 161 of multilayer printed wiring board 10. Then, IC chip 90 is pressed against printed wiring board 10 to connect gold-stud bumps 91 and solder bumps 76 of pads 161, and IC chip 90 is mounted on multilayer printed wiring board 10. Then, multilayer printed wiring board 10 is mounted on daughterboard 94 by means of solder bumps 78 (FIG. 20).

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    preparing an insulative board;
    forming a metal film on a surface of the insulative board;
    covering a portion of the metal film with a first plating resist;
    forming a first plated-metal film on the metal film exposed from the first plating resist;
    covering a portion of the first plated-metal film with a second plating resist;
    forming a second plated-metal film on the first plated-metal film exposed from the second plating resist;
    removing the first and second plating resists;
    removing the metal film exposed by the first and second plated-metal films such that a wiring having a pad and a conductive circuit thinner than the pad is formed;
    forming a solder-resist layer on the surface of the insulative board and the wiring;
    forming in the solder-resist layer an opening that exposes the pad and a portion of the conductive circuit contiguous to the pad; and
    forming a solder bump on the pad by a reflow.

2. The method for manufacturing the printed wiring board according to claim 1, wherein the pad thickness is 2-10 µm greater than the circuit thickness.

3. The method for manufacturing the printed wiring board according to claim 2, wherein the pad has a pad width which is substantially the same as a circuit width of the conductive circuit, and the pad width and the circuit width are in a direction parallel to the surface of the insulative board.

4. The method for manufacturing the printed wiring board according to claim 2, wherein the solder bump on the pad has a bump thickness which is greater than a film thickness of a solder film formed on the conductive circuit.

5. The method for manufacturing the printed wiring board according to claim 4, wherein the pad has a pad thickness which is greater than a circuit thickness of the conductive circuit, the pad thickness, the circuit thickness, the bump thickness, and the film thickness are in a direction orthogonally to the surface of the insulative board, and the bump thickness and the film thickness have a ratio which is in a range of 1.1-15.

6. The method for manufacturing the printed wiring board according to claim 1, wherein the pad has a pad width which is substantially the same as a circuit width of the conductive circuit, and the pad width and the circuit width are in a direction parallel to the surface of the insulative board.

7. The method for manufacturing the printed wiring board according to claim 1, wherein the solder bump on the pad has a bump thickness which is greater than a film thickness of a solder film formed on the conductive circuit.

8. The method for manufacturing the printed wiring board according to claim 7, wherein the pad has a pad thickness which is greater than a circuit thickness of the conductive circuit, the pad thickness, the circuit thickness, the bump thickness, and the film thickness are in a direction orthogonally to the surface of the insulative board, and the bump thickness and the film thickness have a ratio which is in a range of 1.1-15.

9. The method for manufacturing the printed wiring board according to claim 1, further comprising forming the metal layer comprising at least one metal selected from the group consisting of Ni, Pd, Pt, Pb, Ag, Sn and Zn on the pad and the conductive circuit exposed through the opening.

* * * * *